United States Patent
Kamata

(10) Patent No.: US 9,734,914 B2
(45) Date of Patent: Aug. 15, 2017

(54) METHOD FOR DRIVING A SEMICONDUCTOR DEVICE HAVING A READING TRANSISTOR COUPLED TO AN OXIDE SEMICONDUCTOR WRITING TRANSISTOR

(71) Applicant: Semiconductor Energy Laboratory Co., Ltd., Atsugi-shi, Kanagawa-ken (JP)

(72) Inventor: Koichiro Kamata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 99 days.

(21) Appl. No.: 14/079,682

(22) Filed: Nov. 14, 2013

(65) Prior Publication Data
US 2014/0071768 A1    Mar. 13, 2014

Related U.S. Application Data

(62) Division of application No. 13/108,636, filed on May 16, 2011, now Pat. No. 8,588,000.

(30) Foreign Application Priority Data

May 20, 2010    (JP) ................................. 2010-116025

(51) Int. Cl.
G11C 16/04       (2006.01)
G11C 16/24       (2006.01)
(Continued)

(52) U.S. Cl.
CPC ............ *G11C 16/24* (2013.01); *G11C 11/404* (2013.01); *G11C 11/565* (2013.01); *G11C 16/26* (2013.01);
(Continued)

(58) Field of Classification Search
CPC ...... G11C 16/08; G11C 16/24; G11C 16/0425; G11C 11/5621; G11C 11/5685
(Continued)

(56) References Cited

U.S. PATENT DOCUMENTS 4,466,081 A    8/1984   Masuoka
5,220,530 A    6/1993   Itoh
(Continued)

FOREIGN PATENT DOCUMENTS

EP    0601590 A    6/1994
EP    0971360 A    1/2000
(Continued)

OTHER PUBLICATIONS

D. Coates et al.; "Optical Studies of the Amorphous Liquid-Cholesteric Liquid Crystal Transition: The "Blue Phase""; Physics Letters, vol. 45A, No. 2; pp. 115-116.
(Continued)

*Primary Examiner* — Andrew Q Tran
(74) *Attorney, Agent, or Firm* — Fish & Richardson P.C.

(57) ABSTRACT

A semiconductor device with a reduced area and capable of higher integration and larger storage capacity is provided. A multi-valued memory cell including a reading transistor which includes a back gate electrode and a writing transistor is used. Data is written by turning on the writing transistor so that a potential according to the data is supplied to a node where one of a source electrode and a drain electrode of the writing transistor and a gate electrode of the reading transistor are electrically connected to each other, and then turning off the writing transistor and holding a predetermined potential in the node. Data is read by supplying a reading control potential to a control signal line connected to
(Continued)

one of a source electrode and a drain electrode of the reading transistor, and then detecting potential change of a reading signal line.

16 Claims, 8 Drawing Sheets

(51) Int. Cl.
G11C 11/404 (2006.01)
G11C 11/56 (2006.01)
H01L 27/11521 (2017.01)
H01L 29/786 (2006.01)
G11C 16/26 (2006.01)
H01L 27/12 (2006.01)

(52) U.S. Cl.
CPC .... *H01L 27/11521* (2013.01); *H01L 29/7869* (2013.01); *H01L 27/1225* (2013.01)

(58) Field of Classification Search
USPC ............ 365/185.23, 185.27, 185.03, 185.08, 365/185.1
See application file for complete search history.

(56) References Cited

U.S. PATENT DOCUMENTS

| | | |
|---|---|---|
| 5,252,846 A | 10/1993 | Tanaka |
| 5,266,509 A | 11/1993 | Chen |
| 5,281,843 A | 1/1994 | Ochii et al. |
| 5,364,805 A | 11/1994 | Taura |
| 5,428,238 A | 6/1995 | Hayashi et al. |
| 5,465,070 A | 11/1995 | Koyama |
| 5,506,436 A | 4/1996 | Hayashi et al. |
| 5,576,571 A | 11/1996 | Hayashi et al. |
| 5,578,852 A | 11/1996 | Hayashi et al. |
| 5,578,853 A | 11/1996 | Hayashi et al. |
| 5,581,106 A | 12/1996 | Hayashi et al. |
| 5,610,547 A | 3/1997 | Koyama |
| 5,731,856 A | 3/1998 | Kim |
| 5,744,864 A | 4/1998 | Cillessen |
| 6,011,729 A * | 1/2000 | Choi ................... 365/189.05 |
| 6,127,702 A | 10/2000 | Yamazaki |
| 6,294,274 B1 | 9/2001 | Kawazoe |
| 6,563,174 B2 | 5/2003 | Kawasaki |
| 6,570,206 B1 | 5/2003 | Sakata |
| 6,727,522 B1 | 4/2004 | Kawasaki |
| 6,873,009 B2 | 3/2005 | Hisamoto et al. |
| 6,894,674 B2 | 5/2005 | Nakajima et al. |
| 6,982,897 B2 * | 1/2006 | Luk et al. ................ 365/149 |
| 7,030,436 B2 | 4/2006 | Forbes |
| 7,049,190 B2 | 5/2006 | Takeda |
| 7,061,014 B2 | 6/2006 | Hosono |
| 7,064,346 B2 | 6/2006 | Kawasaki |
| 7,105,868 B2 | 9/2006 | Nause |
| 7,200,050 B2 | 4/2007 | Kato |
| 7,211,825 B2 | 5/2007 | Shih |
| 7,282,782 B2 | 10/2007 | Hoffman |
| 7,297,977 B2 | 11/2007 | Hoffman |
| 7,323,356 B2 | 1/2008 | Hosono |
| 7,385,224 B2 | 6/2008 | Ishii |
| 7,402,506 B2 | 7/2008 | Levy |
| 7,403,435 B2 | 7/2008 | Kato |
| 7,411,209 B2 | 8/2008 | Endo |
| 7,432,906 B2 | 10/2008 | Nakajima et al. |
| 7,453,065 B2 | 11/2008 | Saito |
| 7,453,087 B2 | 11/2008 | Iwasaki |
| 7,459,743 B2 | 12/2008 | Mandelman et al. |
| 7,462,862 B2 | 12/2008 | Hoffman |
| 7,468,304 B2 | 12/2008 | Kaji |
| 7,501,293 B2 | 3/2009 | Ito |
| 7,541,614 B2 | 6/2009 | Kato |
| 7,558,134 B2 | 7/2009 | Kitagawa |
| 7,674,650 B2 | 3/2010 | Akimoto |
| 7,732,819 B2 | 6/2010 | Akimoto |
| 7,790,530 B2 | 9/2010 | Mandelman et al. |
| 7,858,985 B2 | 12/2010 | Kato |
| 8,049,219 B2 | 11/2011 | Kato |
| 8,106,400 B2 | 1/2012 | Miyairi |
| 8,289,753 B2 | 10/2012 | Yamazaki |
| 8,513,661 B2 | 8/2013 | Takahashi et al. |
| 8,780,629 B2 * | 7/2014 | Furutani et al. ......... 365/185.08 |
| 2001/0046027 A1 | 11/2001 | Tai |
| 2002/0056838 A1 | 5/2002 | Ogawa |
| 2002/0132454 A1 | 9/2002 | Ohtsu |
| 2003/0189401 A1 | 10/2003 | Kido |
| 2003/0209739 A1 | 11/2003 | Hisamoto |
| 2003/0218222 A1 | 11/2003 | Wager, III |
| 2004/0038446 A1 | 2/2004 | Takeda |
| 2004/0127038 A1 | 7/2004 | Carcia |
| 2004/0129963 A1 | 7/2004 | Amo |
| 2005/0017302 A1 | 1/2005 | Hoffman |
| 2005/0199959 A1 | 9/2005 | Chiang |
| 2006/0035452 A1 | 2/2006 | Carcia |
| 2006/0043377 A1 | 3/2006 | Hoffman |
| 2006/0091793 A1 | 5/2006 | Baude |
| 2006/0108529 A1 | 5/2006 | Saito |
| 2006/0108636 A1 | 5/2006 | Sano |
| 2006/0110867 A1 | 5/2006 | Yabuta |
| 2006/0113536 A1 | 6/2006 | Kumomi |
| 2006/0113539 A1 | 6/2006 | Sano |
| 2006/0113549 A1 | 6/2006 | Den |
| 2006/0113565 A1 | 6/2006 | Abe |
| 2006/0169973 A1 | 8/2006 | Isa |
| 2006/0170111 A1 | 8/2006 | Isa |
| 2006/0197092 A1 | 9/2006 | Hoffman |
| 2006/0208977 A1 | 9/2006 | Kimura |
| 2006/0228974 A1 | 10/2006 | Thelss |
| 2006/0231882 A1 | 10/2006 | Kim |
| 2006/0238135 A1 | 10/2006 | Kimura |
| 2006/0244107 A1 | 11/2006 | Sugihara |
| 2006/0284171 A1 | 12/2006 | Levy |
| 2006/0284172 A1 | 12/2006 | Ishii |
| 2006/0292777 A1 | 12/2006 | Dunbar |
| 2007/0024187 A1 | 2/2007 | Shin |
| 2007/0046191 A1 | 3/2007 | Saito |
| 2007/0047293 A1 | 3/2007 | Mandelman et al. |
| 2007/0052025 A1 | 3/2007 | Yabuta |
| 2007/0054507 A1 | 3/2007 | Kaji |
| 2007/0090365 A1 | 4/2007 | Hayashi |
| 2007/0108446 A1 | 5/2007 | Akimoto |
| 2007/0152217 A1 | 7/2007 | Lai |
| 2007/0172591 A1 | 7/2007 | Seo |
| 2007/0187678 A1 | 8/2007 | Hirao |
| 2007/0187760 A1 | 8/2007 | Furuta |
| 2007/0194379 A1 | 8/2007 | Hosono |
| 2007/0252928 A1 | 11/2007 | Ito |
| 2007/0272922 A1 | 11/2007 | Kim |
| 2007/0287296 A1 | 12/2007 | Chang |
| 2008/0006877 A1 | 1/2008 | Mardilovich |
| 2008/0038882 A1 | 2/2008 | Takechi |
| 2008/0038929 A1 | 2/2008 | Chang |
| 2008/0050595 A1 | 2/2008 | Nakagawara |
| 2008/0073653 A1 | 3/2008 | Iwasaki |
| 2008/0083950 A1 | 4/2008 | Pan |
| 2008/0106191 A1 | 5/2008 | Kawase |
| 2008/0128689 A1 | 6/2008 | Lee |
| 2008/0129195 A1 | 6/2008 | Ishizaki |
| 2008/0166834 A1 | 7/2008 | Kim |
| 2008/0182358 A1 | 7/2008 | Cowdery-Corvan |
| 2008/0224133 A1 | 9/2008 | Park |
| 2008/0254569 A1 | 10/2008 | Hoffman |
| 2008/0258139 A1 | 10/2008 | Ito |
| 2008/0258140 A1 | 10/2008 | Lee |
| 2008/0258141 A1 | 10/2008 | Park |
| 2008/0258143 A1 | 10/2008 | Kim |
| 2008/0296568 A1 | 12/2008 | Ryu |
| 2009/0068773 A1 | 3/2009 | Lai |
| 2009/0073325 A1 | 3/2009 | Kuwabara |
| 2009/0114910 A1 | 5/2009 | Chang |
| 2009/0134399 A1 | 5/2009 | Sakakura |
| 2009/0152506 A1 | 6/2009 | Umeda |
| 2009/0152541 A1 | 6/2009 | Maekawa |

(56) References Cited

U.S. PATENT DOCUMENTS

| | | |
|---|---|---|
| 2009/0278122 A1 | 11/2009 | Hosono |
| 2009/0280600 A1 | 11/2009 | Hosono |
| 2010/0065844 A1 | 3/2010 | Tokunaga |
| 2010/0092800 A1 | 4/2010 | Itagaki |
| 2010/0102372 A1 | 4/2010 | Lee et al. |
| 2010/0109002 A1 | 5/2010 | Itagaki |
| 2010/0148171 A1 | 6/2010 | Hayashi |
| 2010/0244022 A1 | 9/2010 | Takahashi et al. |
| 2011/0089927 A1 | 4/2011 | Yamazaki |
| 2011/0110145 A1 | 5/2011 | Yamazaki |
| 2011/0122670 A1 | 5/2011 | Yamazaki |
| 2011/0134683 A1 | 6/2011 | Yamazaki |
| 2012/0104386 A1 | 5/2012 | Miyairi |

FOREIGN PATENT DOCUMENTS

| | | |
|---|---|---|
| EP | 1343134 A | 9/2003 |
| EP | 1 737 044 A1 | 12/2006 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-097063 A | 4/1990 |
| JP | 04-061160 A | 2/1992 |
| JP | 04-099060 A | 3/1992 |
| JP | 05-251705 A | 9/1993 |
| JP | 07-099251 A | 4/1995 |
| JP | 08-264794 A | 10/1996 |
| JP | 10-084047 A | 3/1998 |
| JP | 11-016344 A | 1/1999 |
| JP | 11-505377 T | 5/1999 |
| JP | 2000-044236 A | 2/2000 |
| JP | 2000-150900 A | 5/2000 |
| JP | 2001-028443 A | 1/2001 |
| JP | 2001-351386 A | 12/2001 |
| JP | 2002-076356 A | 3/2002 |
| JP | 2002-175053 A | 6/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-214512 A | 7/2004 |
| JP | 2004-273614 A | 9/2004 |
| JP | 2004-273732 A | 9/2004 |
| JP | 2005-011492 A | 1/2005 |
| JP | 2009-506526 | 2/2009 |
| JP | 2009-135350 A | 6/2009 |
| JP | 2009-176865 A | 8/2009 |
| TW | 461096 | 10/2001 |
| WO | WO 00/70683 A1 | 11/2000 |
| WO | WO 01/73846 A1 | 10/2001 |
| WO | WO 2004/114391 A1 | 12/2004 |
| WO | WO-2007/023011 | 3/2007 |
| WO | WO-2009/093722 | 7/2009 |

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

(56) References Cited

OTHER PUBLICATIONS

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT/JP2011/061697) dated Aug. 2, 2011, in English.

Written Opinion (Application No. PCT/JP2011/061697) dated Aug. 2, 2011, in English.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; vol. 41, No. 6, Jun. 1, 1994; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: the "Blue Phase," Physics Letters, Sep. 10, 1973, vol. 45A, No. 2, pp. 115-211.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and exmples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—Bo Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

(56) References Cited

OTHER PUBLICATIONS

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Taiwanese Office Action (Application No. 104144472) Dated Aug. 26, 2016.

* cited by examiner

US 9,734,914 B2

METHOD FOR DRIVING A SEMICONDUCTOR DEVICE HAVING A READING TRANSISTOR COUPLED TO AN OXIDE SEMICONDUCTOR WRITING TRANSISTOR

CROSS-REFERENCE TO RELATED APPLICATIONS

This application is a divisional of U.S. application Ser. No. 13/108,636, filed May 16, 2011, now allowed, which claims the benefit of a foreign priority application filed in Japan as Serial No. 2010-116025 on May 20, 2010, both of which are incorporated by reference.

TECHNICAL FIELD

The invention disclosed herein relates to a semiconductor device using a semiconductor element and a method for driving the semiconductor device.

In this specification, a semiconductor device means all types of devices which can function by utilizing semiconductor characteristics, and a semiconductor circuit, a memory device, an imaging device, a display device, an electro-optical device, an electronic device, and the like are all semiconductor devices.

BACKGROUND ART

Storage devices using semiconductor elements are broadly classified into two categories: a volatile device that loses stored data when power supply stops, and a nonvolatile device that holds stored data even when power is not supplied.

A typical example of a volatile storage device is a DRAM (dynamic random access memory). A DRAM stores data in such a manner that a transistor included in a storage element is selected and electric charge is held in a capacitor.

When data is read from a DRAM, electric charge in a capacitor is lost according to the above-described principle; thus, another writing operation is necessary whenever data is read out. Moreover, a transistor included in a storage element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need a refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a nonvolatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, and thus the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, a high voltage is necessary for holding of electric charge in the floating gate or removal of the electric charge, and a circuit for generating high voltage is also necessary. Further, it takes a relatively long time to hold or remove electric charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, an object of one embodiment of the invention disclosed herein is to provide a semiconductor device with a novel structure which is capable of holding stored data even when power is not supplied and has no limitation on the number of times of writing.

Another object is to provide a semiconductor device capable of higher integration and larger storage capacity.

Another object is to provide a highly reliable semiconductor device with a stable operation.

Another object is to provide a semiconductor device capable of a high-speed operation.

Another object is to provide a semiconductor device which consumes low power.

One embodiment of the invention disclosed in this specification achieves at least one of the above objects.

One embodiment of the present invention is a semiconductor device including a memory cell which includes a writing transistor and a reading transistor including a back gate electrode, a control signal line, a bit line, a word line, and a reading signal line, wherein a gate electrode of the reading transistor is electrically connected to one of a source electrode and a drain electrode of the writing transistor, one of a source electrode and a drain electrode of the reading transistor is electrically connected to the control signal line, the other of the source electrode and the drain electrode of the reading transistor is electrically connected to the reading signal line, a gate electrode of the writing transistor is electrically connected to the word line, and the other of the source electrode and the drain electrode of the writing transistor is electrically connected to the bit line.

One embodiment of the present invention is a semiconductor device including a memory cell which includes a first transistor including a back gate electrode and a second transistor including an oxide semiconductor, a first wiring, a second wiring, a third wiring, and a fourth wiring, wherein a gate electrode of the first transistor is electrically connected to one of a source electrode and a drain electrode of the second transistor, one of a source electrode and a drain electrode of the first transistor and the back gate electrode of the first transistor are electrically connected to the first wiring, the other of the source electrode and the drain electrode of the first transistor is electrically connected to the fourth wiring, a gate electrode of the second transistor is electrically connected to the third wiring, and the other of the source electrode and the drain electrode of the second transistor is electrically connected to the second wiring.

In the semiconductor devices, a transistor including an oxide semiconductor is used as the writing transistor or the second transistor, whereby refresh operations can be performed much less frequently and a nonvolatile semiconductor device can be realized.

In the semiconductor devices, for a semiconductor layer in the writing transistor or the second transistor, a material having an energy gap of larger than 3 eV is preferably used.

Note that in this specification and the like, a nonvolatile semiconductor device indicates a semiconductor device which can hold data for a given period of time or longer ($1\times10^4$ seconds or longer, preferably $1\times10^6$ seconds or longer) even when no power is supplied thereto.

In the semiconductor devices, a potential supplied to the bit line or the second wiring is supplied through the writing transistor or the second transistor to a node where the one of the source electrode and the drain electrode of the writing transistor or the second transistor and the gate electrode of the reading transistor or the first transistor are connected to each other, and a predetermined potential is held in the node, so that data is written.

By changing potentials held in the node according to data to be stored, a multi-valued type semiconductor device can function in which plural kinds of data can be stored in one memory cell.

As variation in the threshold voltage of the reading transistor or the first transistor is smaller, the memory cell can be multi-valued more easily. In addition, as the variation in the threshold voltage of the reading transistor or the first transistor is smaller, a semiconductor device with larger storage capacity, more stable operation, and higher reliability can be realized.

Multi-valued data stored in the memory cell can be read by supplying (precharging) electric charge to the reading signal line or the fourth wiring, and then sequentially supplying a plurality of reading control potentials $V_{CL}$ to the reading signal line or the first wiring and detecting potential change of the reading signal line or the fourth wiring.

The plurality of reading control potentials $V_{CL}$ are preferably supplied sequentially from the smallest absolute value of the plurality of reading control potentials $V_{CL}$ because power consumption can be reduced.

In addition, a capacitor may be added to the node where data is stored. With the addition of the capacitor, data stored in the node can be held for a longer time.

With one embodiment of the present invention, the area of a semiconductor device can be reduced. Thus, a semiconductor device capable of higher integration and larger storage capacity can be provided.

Since data writing does not need a high voltage, problems such as deterioration of a gate insulating layer do not easily arise; thus, the number of times data can be rewritten and reliability are greatly increased.

Further, an operation for erasing data is not needed, whereby a high-speed operation can be easily realized.

A transistor including an oxide semiconductor is used for a memory cell, whereby stored data can be held for a quite long period of time. In other words, a refresh operation becomes unnecessary or refresh operations can be performed much less frequently so that power consumption of the semiconductor device can be reduced. Moreover, stored data can be held for a long time even when power is not supplied to the semiconductor device.

BEST MODE FOR CARRYING OUT THE INVENTION

Figure 1A:
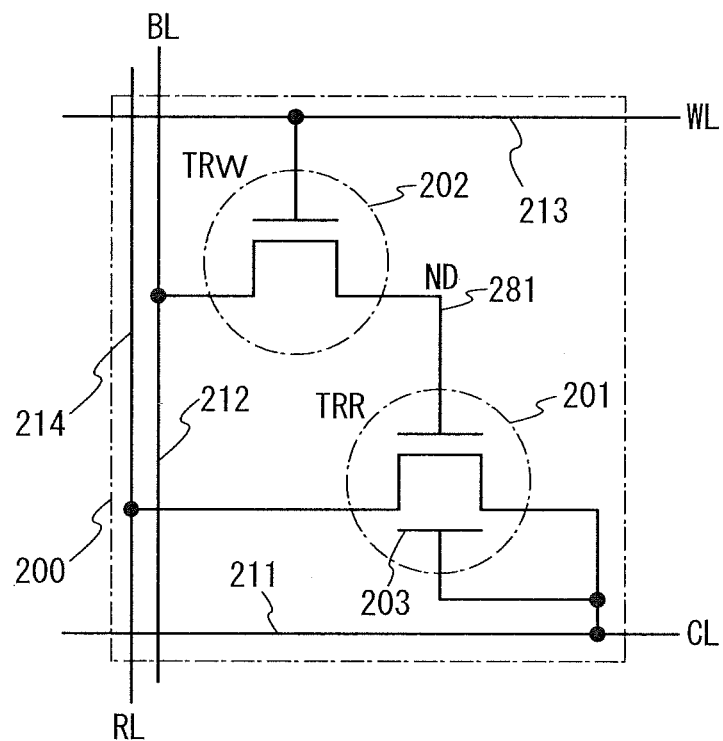
FIGS. 1A and 1B are circuit diagrams of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

A transistor is a kind of semiconductor elements and can achieve amplification of a current or a voltage, a switching operation for controlling conduction or non-conduction, or the like. A transistor in this specification includes an insulated-gate field effect transistor (IGFET) and a thin film transistor (TFT).

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Note that in this specification and the like, ordinal numbers such as "first", "second", and "third" are used in order to avoid confusion among components, and the terms do not mean limitation of the number of components.

In addition, in this specification and the like, the term such as "electrode" or "wiring" does not limit a function of a component. For example, an "electrode" is sometimes used as part of a "wiring" and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in a circuit operation, for example. Therefore, the terms "source" and "drain" can be interchanged with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Embodiment 1

In this embodiment, circuit structures and operations of semiconductor devices according to one embodiment of the disclosed invention will be described with reference to FIGS. 1A and 1B and FIG. 2. In this embodiment, the case where an n-channel transistor in which electrons are majority carriers is used as a transistor is described.

Figure 1B:
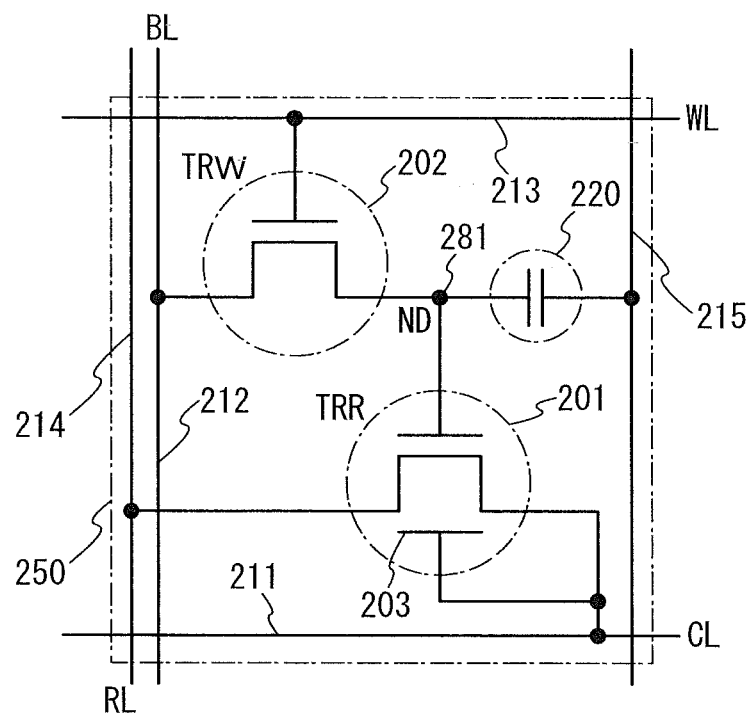
Figure 2:
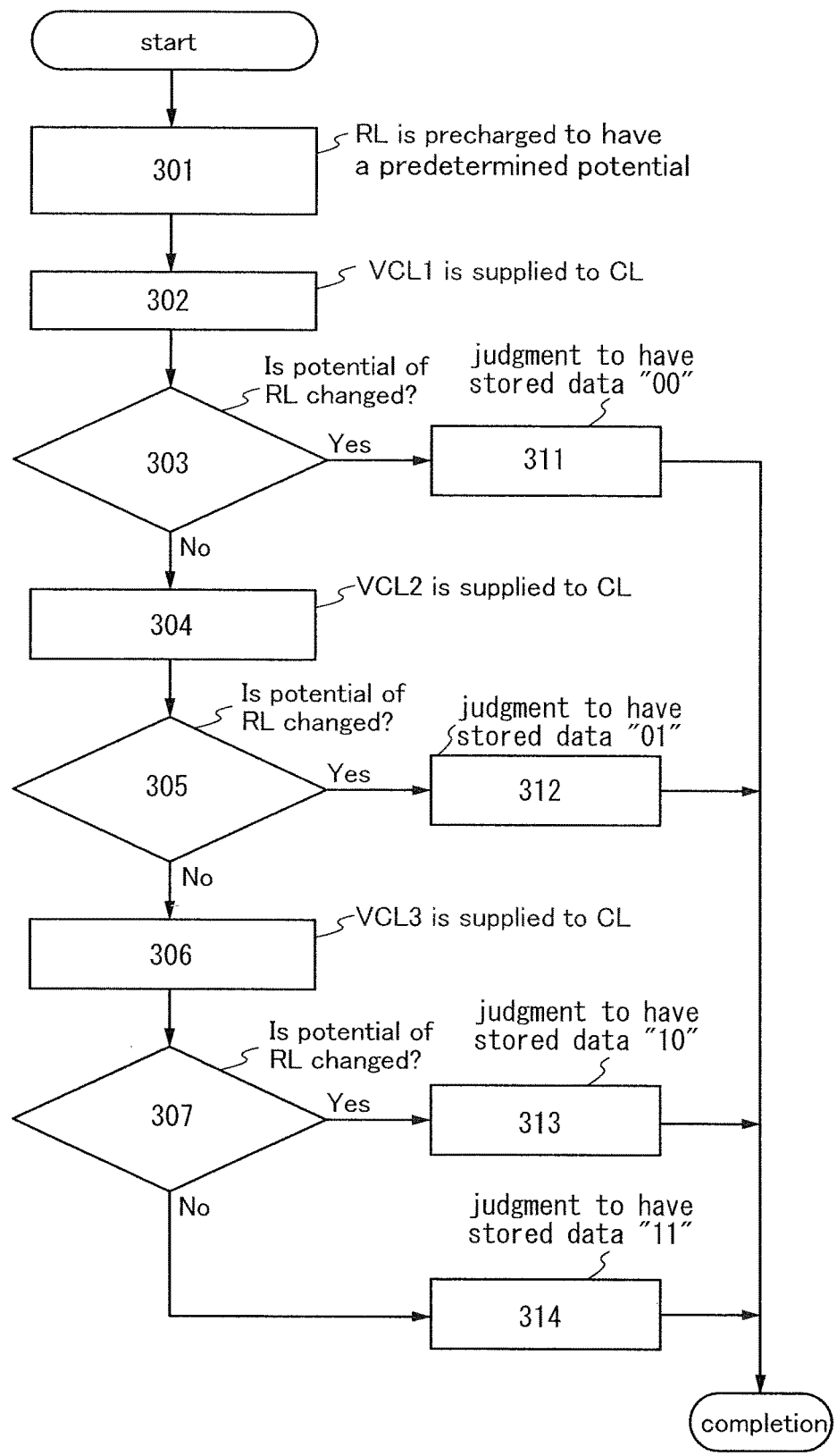
FIG. 2 is a flowchart illustrating operations of a semiconductor device.

In FIGS. 1A and 1B, the circuit structures of the semiconductor devices disclosed in this embodiment are illustrated. The semiconductor device illustrated in FIG. 1A includes a nonvolatile memory cell 200 including a first transistor 201 and a second transistor 202. In FIG. 1A, a first wiring 211 (also referred to as a control signal line CL) and one of a source electrode and a drain electrode of the first transistor 201 (also referred to as a transistor $TR_R$) are electrically connected to each other. The other of the source electrode and the drain electrode of the first transistor 201 is electrically connected to a fourth wiring 214 (also referred to as a reading signal line RL). The first transistor 201 includes a back gate electrode 203, and the back gate electrode 203 is electrically connected to the first wiring 211.

Note that the back gate electrode is provided such that a channel formation region formed in a semiconductor layer is placed between a gate electrode and the back gate electrode. The back gate electrode is formed using a conductive layer, and has an effect of relieving an electric field which is unintentionally applied to the channel formation region and reducing variation in the threshold voltage of a transistor. In addition, the back gate electrode can function in a manner similar to that of the gate electrode. By changing a potential of the back gate electrode, the threshold voltage of the transistor can be changed.

One of a source electrode and a drain electrode of the second transistor 202 (also referred to as a transistor $TR_W$) and a gate electrode of the first transistor 201 are electrically connected to each other. The other of the source electrode and the drain electrode of the second transistor 202 are electrically connected to a second wiring 212 (also referred to as a bit line BL). A gate electrode of the second transistor 202 is electrically connected to a third wiring 213 (also referred to as a word line WL). The first transistor 201 functions as a reading transistor, and the second transistor 202 functions as a writing transistor.

The off-state current of the second transistor 202, which is the writing transistor, is 100 zA ($1 \times 10^{-19}$ A) or less, preferably 10 zA ($1 \times 10^{-20}$ A) or less, more preferably 1 zA ($1 \times 10^{-21}$ A) or less at an ambient temperature (e.g., 25° C.). Although it is difficult to achieve such a low off-state current with a transistor including a general silicon semiconductor, it can be achieved with a transistor including an oxide semiconductor that is processed under an appropriate condition and has a large energy gap of approximately 3.0 eV to 3.5 eV. Therefore, the transistor including the oxide semiconductor as the semiconductor layer is preferably used as the writing transistor.

Further, with the use of the transistor including the oxide semiconductor as the writing transistor, rising of a writing pulse to the memory cell can be extremely sharp owing to a small subthreshold swing (S value).

In this embodiment, as the second transistor 202, which is the writing transistor, the transistor including the oxide semiconductor is used. A transistor including an oxide semiconductor has an extremely low leakage current between the source and the drain in an off state (off-state current). Therefore, by turning off the second transistor 202, electric charge in a node 281 (also referred to as a node ND) can be held for a very long time. In the node ND, the one of the source electrode and the drain electrode of the second transistor 202 and the gate electrode of the first transistor 201 are electrically connected to each other.

Although there is no particular limitation on a material for a semiconductor layer used in the first transistor 201, which is the reading transistor, it is desirable to use a transistor which operates at high speed in order to increase the reading rate. For example, a transistor with a switching rate of 1 nano second or lower is preferably used as the reading transistor.

The off-state current of the first transistor 201, which is the reading transistor, does not need to be as low as that of the second transistor 202. A transistor with a higher switching rate (e.g., a transistor with higher field effect mobility) than the second transistor 202 can be used as the first transistor 201 in order to increase operation speed of the memory cell. That is, as the first transistor 201, a transistor including a semiconductor material other than the oxide semiconductor may be used. In some cases, the off-state current of the first transistor 201 is higher than that of the second transistor 202 depending on the semiconductor material selected. In addition, an oxide semiconductor material may be used for the semiconductor layer of the first transistor 201, for example, by making a channel length of the first transistor 201 short as needed.

As the semiconductor material other than the oxide semiconductor for the first transistor 201, for example, silicon, germanium, silicon germanium, silicon carbide, gallium arsenide, or the like can be used. Alternatively, an organic semiconductor material or the like may be used. The first transistor 201 including such a semiconductor material can be operated at sufficiently high speed, so that it can perform reading of stored data at high speed. In other words, the high-speed operation of the semiconductor device can be realized.

Note that when the second transistor 202 is in an off state, the node 281 can be regarded as being embedded in an insulator (a so-called floating state) and thus holds a potential. That is, a potential of the gate electrode of the first transistor 201 is held. The node 281 has the same effect as a floating gate of a floating-gate transistor that is used as a nonvolatile memory element. The off-state current of the second transistor 202 including the oxide semiconductor is lower than or equal to one hundred thousandth of the off-state current of a transistor including a silicon semiconductor or the like; thus, loss of electric charge accumulated in the node 281 due to a leakage current of the second transistor 202 is negligible. That is, with the second transistor 202 including the oxide semiconductor, a nonvolatile memory cell can be realized.

As long as the off-state current of the second transistor 202 is substantially 0 for example, a refresh operation needed for a conventional DRAM can be unnecessary or refresh operations can be performed much less frequently (e.g., about once a month or a year). Accordingly, power consumption of the semiconductor device can be reduced sufficiently.

In a memory cell 250 illustrated in FIG. 1B, a capacitor 220 is added to the memory cell 200 illustrated in FIG. 1A. In FIG. 1B, one electrode of the capacitor 220 is electrically connected to the gate electrode of the first transistor 201, and the other electrode of the capacitor 220 is electrically connected to a fifth wiring 215.

Although a capacitor is not needed in operational principle, with addition of the capacitor 220, a semiconductor device disclosed in this embodiment can hold a potential of the node 281 for a longer time.

The capacitor 220 facilitates holding of electric charge supplied to the node 281 and enables more accurate reading of data. The potential of the fifth wiring 215 connected to the other electrode of the capacitor 220 may be set to 0 V or a fixed potential such as a common potential. Instead of the fixed potential, any potential is acceptable as long as the potential of the fifth wiring 215 is the same in the writing operation and the reading operation.

Further, in the semiconductor device disclosed in this embodiment, data can be directly rewritten by rewriting of new data to a memory cell. For that reason, an erasing operation which is needed for a flash memory or the like is unnecessary, so that a reduction in operation speed due to the erasing operation can be prevented. In other words, the high-speed operation of the semiconductor device can be realized. Moreover, a high voltage needed for a conventional floating-gate transistor to write and erase data is unnecessary; thus, power consumption of the semiconductor device can be further reduced.

Next, a writing (rewriting) operation of data to the memory cell 200 is described. The memory cell 200 disclosed in this embodiment can function as a multi-valued memory cell in which a plural kinds of data can be stored in one memory cell. In this embodiment, an example in which the memory cell 200 is used as a four-valued (two-bit) memory cell is described.

First, the potential of the third wiring 213 (the word line WL) connected to the memory cell 200 which is selected as a memory cell to which data is to be written is set to a potential at which the second transistor 202, which is the writing transistor, is turned on, so that the second transistor 202 is turned on. A high-level potential $V_{WLH}$ is supplied to the third wiring 213 here. Accordingly, a potential of the second wiring 212 (the bit line BL) connected to the selected memory cell 200 is supplied to the node 281 (the node ND).

Four data "00", "01", "10", and "11" which are to be stored in the memory cell 200 correspond to four potentials $V_1$, $V_2$, $V_3$, and $V_4$, respectively. Among the four potentials, a potential corresponding to a desired data is supplied to the bit line BL, so that the desired data can be stored in the node ND through the second transistor 202.

Since the first transistor 201 described in this embodiment is an n-channel transistor, the potentials $V_1$ to $V_4$ to be written to the node ND are lower than the threshold voltage of the first transistor 201. When a p-channel transistor in which holes are majority carriers is used as the first transistor 201, the potentials $V_1$ to $V_4$ to be written to the node ND are higher than the threshold voltage of the first transistor 201. In any case, the potentials $V_1$ to $V_4$ are set such that the off-state of the first transistor 201 can be maintained.

When the difference between a plurality of potentials to be written to the node ND, e.g., the difference between the potential $V_1$ and the potential $V_2$, is too small, correct data is not written to the node ND and writing defects occur. The minimum potential difference for suppressing the occurrence of writing defects can be determined in consideration of resolution of a potential generating circuit by which a potential is supplied to the bit line BL, resolution of a potential detecting circuit by which potential change of the reading signal line RL is detected when data is read, variation in the threshold voltage of the first transistor 201, and the like.

The variation in the threshold voltage of the first transistor 201 can be determined using a standard deviation of the variation in the threshold voltage of the first transistor 201 within possible ambient temperatures and under possible usage conditions. Note that when a plurality of memory cells 200 are used, a standard deviation of the variation in the threshold voltage of all of the first transistors 201 within possible ambient temperatures and under possible usage conditions is used.

Specifically, the minimum potential difference is the largest value among the resolution of the potential generating circuit, the resolution of the potential detecting circuit, and the variation in the threshold voltage of the first transistor 201. The variation in the threshold voltage of the first transistor 201 used here is a value twice or more as large as the standard deviation, preferably three times or more as large as the standard deviation, more preferably four times or more as large as the standard deviation. When the minimum potential difference is determined using a value twice or more as large as the standard deviation, the probability of the occurrence of writing defects can be 4.6% or lower. When the minimum potential difference is determined using a value three times or more as large as the standard deviation, the probability of the occurrence of writing defects can be 0.3% or lower. When the minimum potential difference is determined using a value four times or more as large as the standard deviation, the probability of the occurrence of writing defects can be 0.006% or lower.

As the variation in the threshold voltage of the first transistor 201 is smaller, storage capacity of the semiconductor device can be increased more easily. Since variation in the threshold voltage of a transistor including an oxide semiconductor for a semiconductor layer is small in a wide temperature range, the first transistor 201 preferably includes the oxide semiconductor for the semiconductor layer, so that the storage capacity of the semiconductor device can be increased easily and the probability of the occurrence of writing defects can be lower.

In this embodiment, the minimum potential difference is 1 V, the potential $V_1$ is −1 V, the potential $V_2$ is −2 V, the potential $V_3$ is −3 V, and the potential $V_4$ is −4 V. For example, when the data "10" is to be stored in the node ND, −3 V is supplied to the bit line BL, and −3 V is written in the node ND through the second transistor 202. In this manner, data can be stored in the memory cell 200 (a writing mode). After completion of the writing, the potential of the third wiring 213 is set to a potential at which the second transistor 202 is turned off, so that the second transistor 202 is turned off. A low-level potential $V_{WLL}$ is supplied to the third wiring 213 here.

In addition, when the memory cell 200 is used as an eight-valued (three-bit) memory cell, eight potentials respectively corresponding to eight data are used. A four-bit memory cell and a five-bit memory cell can be realized in a similar manner, but without limitation on the number of bits, the memory cell 200 can also be used simply as a three-valued memory cell, a ten-valued memory cell, or the like. That is, writing and reading of any of n different potentials (n is a given integer of 2 or more) can be performed.

In the semiconductor device described in this embodiment, electric charge travel in a gate insulating film (a tunnel insulating film) is not caused in the writing (rewriting)

operation unlike in a floating-gate transistor, but the electric charge travel is caused by a switching operation of the second transistor 202. Therefore, there is no limitation on the number of the writing operations in principle, and the resistance to rewriting is extremely high. In addition, a high voltage needed for writing and erasing in the floating-gate transistor is unnecessary; thus, power consumption of the semiconductor device can be reduced.

Next, a reading operation in which data stored in the memory cell 200 is read is described. First, the potential of the third wiring 213 is set to a potential at which the second transistor 202, which is the writing transistor, is turned off, so that the second transistor 202 is turned off. The low-level potential $V_{WLL}$ is supplied to the third wiring 213 here. Next, electric charge is supplied (precharging) to the fourth wiring 214, so that the potential of the fourth wiring 214 is 0 V.

Next, a reading control potential $V_{CL}$ is supplied to the first wiring 211 (the control signal line CL) of a memory cell from which data is to be read, and potential change of the fourth wiring 214 (the reading signal line RL) is detected, so that data stored in the memory cell 200 can be read (a reading mode). Note that the potential supplied to the fourth wiring 214 by the precharging is not limited to this as long as the potential is higher (lower when the first transistor 201 is a p-channel transistor) than a potential held in the node ND and different from the reading control potential $V_{CL}$.

Data is read from an n-valued memory cell 200 by sequentially supplying n−1 reading control potentials $V_{CL}$ to the control signal line CL and detecting potential change of the reading signal line RL. When the memory cell is a four-valued memory cell, reading control potentials $V_{CL1}$ to $V_{CL3}$ are sequentially supplied to the control signal line CL. The levels of the reading control potentials $V_{CL1}$ to $V_{CL3}$ are determined according to the potentials $V_1$ to $V_3$, respectively.

When the threshold voltage of the first transistor 201 is $V_{th1}$, the reading control potential $V_{CLk}$ used for detecting a k-th potential $V_k$ can be set so as to satisfy Formula 1.

$$V_{th1} - V_k \le V_{CLk} < V_{th1} - V_{k+1} \quad \text{[Formula 1]}$$

For example, when the threshold voltage of the first transistor 201 is 2 V, the reading control potential $V_{CL1}$ used for detecting the potential $V_1$ may be set within a range of higher than or equal to 3 V and lower than 4 V, the reading control potential $V_{CL2}$ used for detecting the potential $V_2$ may be set within a range of higher than or equal to 4 V and lower than 5 V, and the reading control potential $V_{CL3}$ used for detecting the potential $V_3$ may be set within a range of higher than or equal to 5 V and lower than 6 V.

Alternatively, the reading control potential $V_{CLk}$ used for detecting the k-th potential $V_k$ may be set so as to satisfy Formula 2.

$$V_{th1} - V_k \le V_{CLk} \le V_{th1} - V_k - \frac{V_{k+1} - V_k}{2} \quad \text{[Formula 2]}$$

When Formula 2 is employed, the reading control potential $V_{CL1}$ used for detecting the potential $V_1$ may be set within a range of higher than or equal to 3 V and lower than or equal to 3.5 V, the reading control potential $V_{CL2}$ used for detecting the potential $V_2$ may be set within a range of higher than or equal to 4 V and lower than or equal to 4.5 V, and the reading control potential $V_{CL3}$ used for detecting the potential $V_3$ may be set within a range of higher than or equal to 5 V and lower than or equal to 5.5 V. The reading control potential $V_{CL}$ is preferably set using Formula 2 because a margin can be secured between $V_{CLk}$ and $V_{CLk+1}$, so that data stored in the memory cell 200 can be read more accurately. Note that when a p-channel transistor is used as the first transistor 201, either of Formula 1 and Formula 2 can be employed with the inequality signs reversed.

Here, the reading operation of the four-valued memory cell 200 given as an example in this embodiment is described with reference to FIG. 1A and a flow chart in FIG. 2. Note that the threshold voltage of the first transistor 201 is 2 V, the reading control potential $V_{CL1}$ is 3.5 V, the reading control potential $V_{CL2}$ is 4.5V, and the reading control potential $V_{CL3}$ is 5.5 V.

First, the reading signal line RL which is electrically connected to the memory cell 200 from which data is to be read is precharged, so that the potential of the reading signal line RL is 0 V (a process 301). Next, the reading control potential $V_{CL1}$ is supplied to the control signal line CL which is electrically connected to the memory cell 200 from which data is to be read (a process 302). Since the back gate electrode 203 of the first transistor 201 is electrically connected to the control signal line CL, the reading control potential $V_{CL1}$, which is 3.5 V, is applied to the back gate electrode 203.

At this time, when the potential $V_1$ is written in the node ND, −1 V is applied to the gate electrode of the first transistor 201. Thus, the sum of the potentials of the gate electrode and the back gate electrode 203, which is 2.5 V, is applied to the semiconductor layer placed between the gate electrode and the back gate electrode 203. Since 2.5 V is higher than the threshold voltage (2 V) of the first transistor 201, the first transistor 201 is turned on, the potential of the control signal line CL is supplied to the reading signal line RL, and the potential of the reading signal line RL is changed. That is, Yes is selected in a judgment 303 in FIG. 2, so that a process 311 is carried out in which the memory cell 200 is judged to have stored the data "00".

When the potential $V_2$ is written in the node ND, −2 V is applied to the gate electrode of the first transistor 201. As this time, even when the reading control potential $V_{CL1}$ is applied to the back gate electrode 203, the sum of the potentials of the gate electrode and the back gate electrode 203 is 1.5 V, which is lower than the threshold voltage of the first transistor 201, so that the first transistor 201 is not turned on. That is, No is selected in the judgment 303 in FIG. 2.

When No is selected in the judgment 303, the reading control potential $V_{CL2}$ is supplied to the control signal line CL and 4.5 V is applied to the back gate electrode 203 (a process 304). As a result, the sum of the potentials of the gate electrode and the back gate electrode 203, which is 2.5 V, is applied to the semiconductor layer placed between the gate electrode and the back gate electrode 203, so that the first transistor 201 is turned on and the potential of the reading signal line RL is changed. That is, Yes is selected in a judgment 305 in FIG. 2, so that a process 312 is carried out in which the memory cell 200 is judged to have stored the data "01".

When the potential $V_3$ is written in the node ND, −3 V is applied to the gate electrode of the first transistor 201. As this time, even when the reading control potential $V_{CL2}$ is applied to the back gate electrode 203, the sum of the potentials of the gate electrode and the back gate electrode 203 is 1.5 V, so that the first transistor 201 is not turned on. That is, No is selected in the judgment 305 in FIG. 2.

When No is selected in the judgment 305, the reading control potential $V_{CL3}$ is supplied to the control signal line CL and 5.5 V is applied to the back gate electrode 203 (a process 306). As a result, the sum of the potentials of the gate electrode and the back gate electrode 203, which is 2.5 V, is applied to the semiconductor layer placed between the gate electrode and the back gate electrode 203, so that the first transistor 201 is turned on and the potential of the reading signal line RL is changed. That is, Yes is selected in a judgment 307 in FIG. 2, so that a process 313 is carried out in which the memory cell 200 is judged to have stored the data "10".

When the potential $V_4$ is written in the node ND, −4 V is applied to the gate electrode of the first transistor 201. As this time, even when the reading control potential $V_{CL3}$ is applied to the back gate electrode 203, the sum of the potentials of the gate electrode and the back gate electrode 203 is 1.5 V, so that the first transistor 201 is not turned on. That is, No is selected in the judgment 307 in FIG. 2.

The selection of No in the judgment 307 is that three values of the data "00", "01", and "10" are not stored in the four-valued memory cell, so that the memory cell 200 is judged to have stored the data "11" (a process 314).

In this manner, by sequentially supplying the reading control potentials $V_{CL1}$ to $V_{CL3}$ to the control signal line CL, reading of the n-valued memory cell can be completed by n−1 operations at the most. In this embodiment, an example in which the reading control potentials $V_{CL1}$ to $V_{CL3}$ are sequentially supplied from the lowest is described; however, the potentials may be sequentially supplied from the highest. Note that when the reading control potentials $V_{CL1}$ to $V_{CL3}$ are sequentially supplied from the highest, a precharging operation to the reading signal line RL is needed every time the reading control potential is changed, resulting in power consumption higher than that in the case where the potentials are sequentially supplied from the lowest.

From the above, the reading control potentials $V_{CL1}$ to $V_{CL3}$ are preferably supplied sequentially from the lowest. When a p-channel transistor is used as the first transistor 201, the potentials are preferably supplied sequentially from the highest owing to the same reason. That is, the reading control potential $V_{CL}$ is preferably supplied sequentially from the smallest absolute value.

The semiconductor device disclosed in this embodiment does not necessarily include a capacitor that is needed for a DRAM, in operational principle; therefore, the area per unit memory cell can be reduced and integration of the memory cells can be increased.

Note that although the writing transistor having a low off-state current is formed using an oxide semiconductor in this embodiment, the disclosed invention is not limited to this. A material which can realize the off-state current characteristics equivalent to those of the oxide semiconductor, such as a wide gap material (Eg>3 eV) like silicon carbide may be used.

The methods and structures described in this embodiment can be combined as appropriate with any of the methods and structures described in the other embodiments.

Embodiment 2

Figure 3:
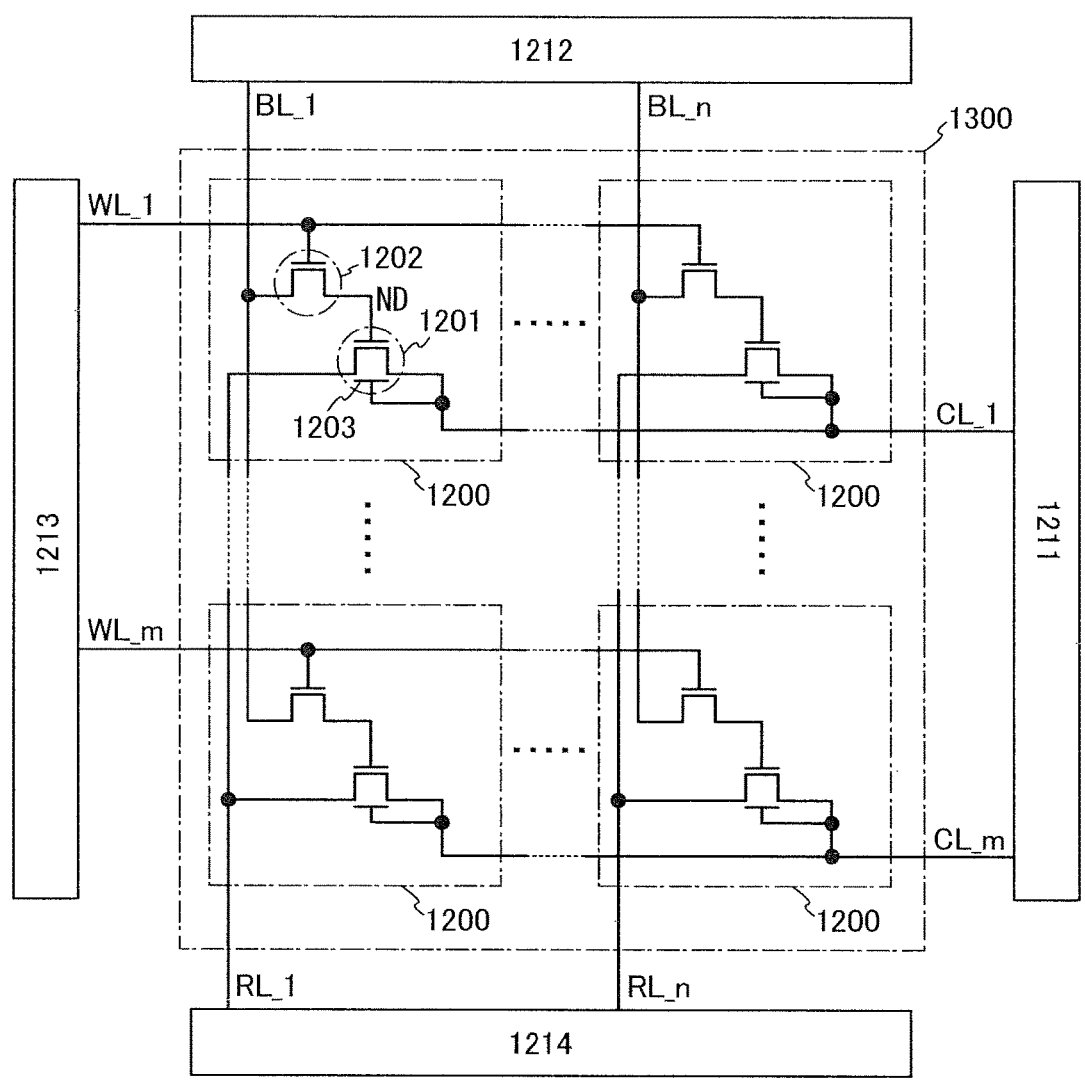
FIG. 3 is a circuit diagram of a semiconductor device.

In this embodiment, an example of a circuit diagram of a semiconductor device having an increased storage capacity by arranging m×n semiconductor devices described in Embodiment 1 will be described with reference to FIG. 3 and FIG. 4. FIG. 3 is a circuit diagram of a so-called NOR semiconductor device in which memory cells 1200 are connected in parallel.

The semiconductor device illustrated in FIG. 3 includes a memory cell array 1300 in which a plurality of memory cells 1200 are arranged in matrix of m rows (in a vertical direction)×n columns (in a horizontal direction) (m and n are natural numbers), m word lines WL, m control signal lines CL, n reading signal lines RL, and n bit lines BL. In addition, the semiconductor device also includes a first driver circuit 1211, a second driver circuit 1212, a third driver circuit 1213, and a fourth driver circuit 1214, as peripheral driver circuits for supplying signals to the memory cell array 1300.

In FIG. 3, the memory cell 1200 has the same structure as the memory cell 200 described in Embodiment 1. That is, each of the memory cells 1200 includes a first transistor 1201 functioning as a reading transistor and a second transistor 1202 functioning as a writing transistor. A gate electrode of the first transistor 1201 and one of a source electrode and a drain electrode of the second transistor 1202 are electrically connected to each other, one of a source electrode and a drain electrode of the first transistor 1201 and the control signal line CL are electrically connected to each other, and the other of the source electrode and the drain electrode of the first transistor 1201 and the reading signal line RL are electrically connected to each other. The first transistor 1201 includes a back gate electrode 1203, and the back gate electrode 1203 is electrically connected to the control signal line CL. The bit line BL and the other of the source electrode and the drain electrode of the second transistor 1202 are electrically connected to each other, and the word line WL and a gate electrode of the second transistor 1202 are electrically connected to each other.

In addition, a memory cell 1200 (i,j) of an i-th row and a j-th column (i is an integer which is greater than or equal to 1 and less than or equal to m, and j is an integer which is greater than or equal to 1 and less than or equal to n) is connected to a word line WL_i, a control signal line CL_i, a bit line BL_j, and a reading signal line RL_j.

The control signal line CL is connected to the first driver circuit 1211, the bit line BL is connected to the second driver circuit 1212, the word line WL is connected to the third driver circuit 1213, and the reading signal line RL is connected to the fourth driver circuit 1214. The second driver circuit 1212 includes a potential generating circuit by which a potential is supplied to the bit line BL, and the fourth driver circuit 1214 includes a potential detecting circuit by which potential change of the reading signal line RL is detected. Note that the first driver circuit 1211 to the fourth driver circuit 1214 are independently provided here; however, a decoder having one or more functions may also be used.

Writing of data to the memory cell 1200 included in the memory cell array 1300 can be performed in a manner similar to that of the writing mode described in Embodiment 1; however, attention should be paid in the writing of the data so that data is not miswritten to a memory cell 1200 which is not a memory cell to which data is to be written. An example of the writing mode in the memory cell array 1300 is described below.

First, to the word line WL_i in a row to which data is to be written, a potential is supplied at which second transistors 1202 included in a memory cell 1200 (i,1) to a memory cell 1200 (i,n) to which the word line WL_i is connected are turned on; accordingly, the second transistors 1202 included in the memory cell 1200 (i,1) to the memory cell 1200 (i,n) are turned on. At this time, to the word lines WL other than the word line WL_i, a potential is supplied at which second transistors 1202 are turned off; accordingly, second transistors 1202 included in memory cells 1200 other than the memory cell 1200 (i,1) to the memory cell 1200 (i,n) are turned off.

Next, potentials $V_k$ are sequentially supplied to a bit line BL_1 to a bit line BL_n. The potentials $V_k$ correspond to respective data which are to be written to the memory cell 1200 (i,1) to the memory cell 1200 (i,n) to which the word line WL_i is connected. After that, the potential of the word line WL_i is set to a potential at which the second transistors 1202 are turned off, so that data is stored (written) in the memory cell 1200 (i,1) to the memory cell 1200 (i,n) to which the word line WL_i is connected.

When data is written in the memory cell 1200 (i,1) to the memory cell 1200 (i,n) to which the word line WL_i is connected, the writing may be sequentially performed in the memory cells 1200 one by one as described above, or may be simultaneously performed in the memory cells 1200. Alternatively, the writing may be performed by dividing the memory cells 1200 into several units.

Next, an example of the reading mode in the memory cell array 1300 is described. The reading of data stored in the memory cell 1200 included in the memory cell array 1300 can be performed in a manner similar to that of the reading mode described in Embodiment 1; however, attention should be paid in the reading of the data so that data is not misread from a memory cell 1200 which is not a memory cell from which data is to be read.

In the reading of data stored in the memory cell 1200 (i,j), in order to prevent interference of data stored in memory cells 1200 other than the memory cell 1200 (i,j) to which the reading signal line RL_j is connected, the potentials of control signal lines $CL_X$ other than the control signal line CL_i are each set such that the potential difference between the potential of a control signal line $CL_X$ and a node ND of a memory cell 1200 to which the control signal line $CL_X$ is connected is lower than the threshold voltage of the first transistor 1201.

Next, in a manner similar to that of the reading mode described in Embodiment 1, the reading control potential $V_{CL}$ is sequentially supplied to the control signal line CL_i and potential change of the reading signal line RL_j is detected, so that data stored in the memory cell 1200 (i,j) can be read.

When data is read from a plurality of memory cells 1200, the reading may be sequentially performed in the memory cells 1200 one by one, or may be simultaneously performed in the memory cell 1200 (i,1) to the memory cell 1200 (i,n) to which the control signal line CL_i is connected. Alternatively, the reading may be performed by dividing the memory cells 1200 into several units.

The semiconductor device disclosed in this embodiment does not necessarily include a capacitor that is needed for a DRAM, in operational principle; therefore, the area per unit memory cell can be reduced and integration of the memory cells can be increased. Therefore, the area per unit memory cell can be further reduced and integration of the memory cells can be further increased. For example, given that the minimum feature size is F, the area occupied by a memory cell can be $15F^2$ to $25F^2$.

Figure 4:
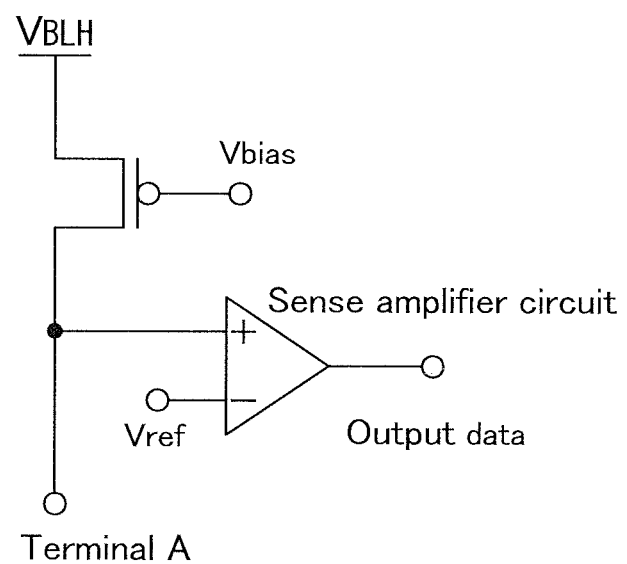
FIG. 4 is a circuit diagram of a semiconductor device.

In FIG. 4, a schematic view of a reading circuit for reading data stored in a memory cell is illustrated. The reading circuit includes a transistor and a sense amplifier circuit.

At the time of reading of data, a terminal A is connected to a bit line BL to which a memory cell from which data is to be read is connected. Further, a bias potential $V_{bias}$ is applied to a gate electrode of the transistor, so that the potential of the terminal A is controlled.

The sense amplifier circuit outputs high data when the potential of the terminal A is higher than a reference potential $V_{ref}$ (e.g., 0 V) or low data when the potential of the terminal A is lower than the reference potential $V_{ref}$. First, the transistor is turned on, and the bit line BL connected to the terminal A is precharged to have a potential $V_{BLH}$. Next, the memory cell from which data is to be read is set to a reading mode, and the potential of the bit line BL connected to the terminal A is compared with the reference potential $V_{ref}$. Thus, the high data or low data is output in accordance with the data stored in the memory cell.

Combination of such a reading circuit and the reading control potential $W_{CL}$ enables judgment of the value of data stored in a memory cell. Note that the reading circuit in this embodiment is an example, and another known circuit may be used.

Although an example of the NOR semiconductor device is shown in this embodiment, a NAND semiconductor device can also be used.

The methods and structures described in this embodiment can be combined as appropriate with any of the methods and structures described in the other embodiments.

Embodiment 3

In this embodiment, a transistor that can be applied to a semiconductor device disclosed in this specification and a method for manufacturing the transistor will be described with reference to FIGS. 5A to 5E and FIGS. 7A to 7D. In this embodiment, as an example of the transistor, a transistor including an oxide semiconductor for a semiconductor layer in which a channel is formed will be described in detail.

Figure 5A:
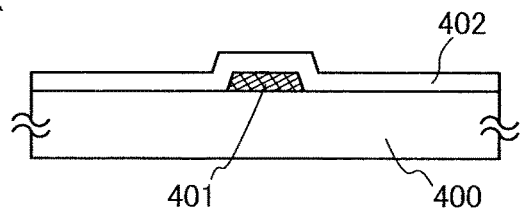
FIGS. 5A to 5E are cross-sectional views relating to manufacturing steps of a semiconductor device.
Figure 5B:
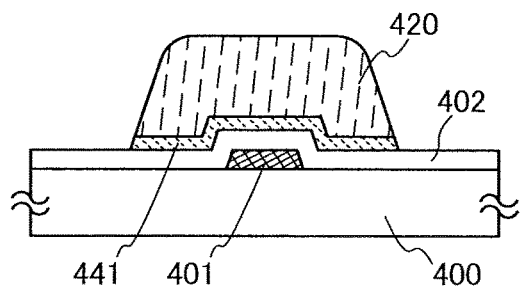
Figure 5C:
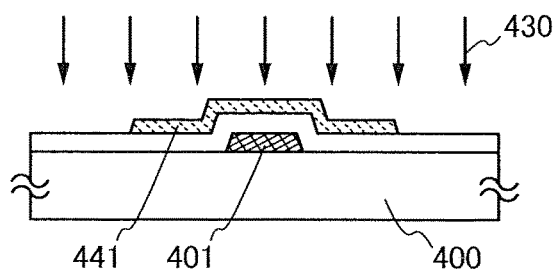
Figure 5D:
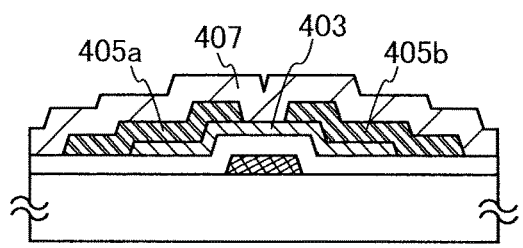
Figure 5E:
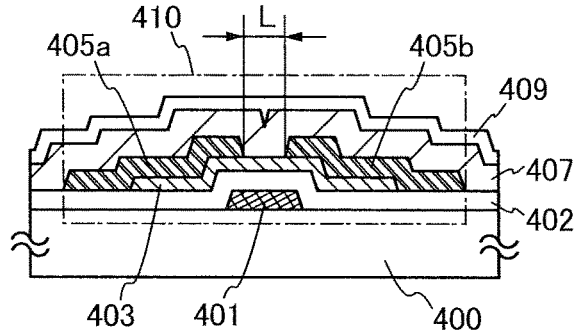

A transistor 410 shown in FIG. 5E includes, over a substrate 400, a gate electrode 401, a gate insulating layer 402, an oxide semiconductor layer 403, a source electrode 405a, and a drain electrode 405b. An insulating layer 407 (also referred to as a first insulating layer) and a protective insulating layer 409 (also referred to as a second insulating layer) are stacked over the transistor 410 in order. A transistor 410 is one of bottom-gate transistors, and is also one of inverted staggered transistors.

FIGS. 5A to 5E illustrate an example of a method for manufacturing the transistor 410.

First, a conductive layer is formed over the substrate 400, and then, a gate electrode 401 is formed through a first photolithography step. Note that a resist mask may be formed by an inkjet method. Formation of the resist mask by an inkjet method needs no photomask; thus, manufacturing cost can be reduced.

There is no particular limitation on a substrate which can be used as the substrate 400, and a glass substrate, a ceramic substrate, a quartz substrate, a sapphire substrate, a crystallized glass substrate, or the like can be used.

Further, a flexible substrate may be used as the substrate 400. In the case where a flexible substrate is used, a transistor may be directly formed over a flexible substrate. Alternatively, a transistor may be formed over a manufacturing substrate, and then, the transistor may be separated from the manufacturing substrate and transferred to a flexible substrate. Note that in order to separate the transistor from the manufacturing substrate and transfer it to the flexible substrate, a separation layer may be provided between the manufacturing substrate and the transistor.

A base layer may be provided between the substrate 400 and the gate electrode 401. The base layer can be formed to have a single-layer structure or a stacked-layer structure using one or more of silicon nitride, silicon oxide, silicon nitride oxide, and silicon oxynitride and has a function of preventing diffusion of impurity elements from the substrate 400.

When a halogen element such as chlorine or fluorine is contained in the base layer, the function of preventing diffusion of impurity elements from the substrate 400 can be further improved. The peak of the concentration of a halogen element to be contained in the base layer is preferably higher than or equal to $1 \times 10^{15}/cm^3$ and lower than or equal to $1 \times 10^{20}/cm^3$ measured by secondary ion mass spectrometry (SIMS).

Note that gallium oxide may be used for the base layer. Alternatively, a stacked-layer structure of a gallium oxide layer and the above insulating layer may be used for the base layer. Gallium oxide is a material which is hardly charged; therefore, variation in threshold voltage due to electric charge buildup of the insulating layer can be suppressed.

The gate electrode 401 can be formed to have a single-layer structure or a stacked-layer structure using a metal material such as molybdenum (Mo), titanium (Ti), tantalum (Ta), tungsten (W), aluminum (Al), copper (Cu), chromium (Cr), neodymium (Nd), scandium (Sc), or magnesium (Mg), or an alloy material containing any of these as a main component.

Next, the gate insulating layer 402 is formed over the gate electrode 401 (see FIG. 5A). The gate insulating layer 402 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, lanthanum oxide, cesium oxide, magnesium oxide, yttrium oxide, hafnium oxide, hafnium silicate ($HfSi_xO_y$, (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. A plasma CVD method, a sputtering method, or the like can be employed. The gate insulating layer 402 is not limited to a single layer, and a stacked layer of different layers may also be used. For example, by a plasma CVD method, a silicon nitride layer ($SiN_y$ (y>0)) may be formed as a first gate insulating layer, and a silicon oxide layer ($SiO_x$ (x>0)) may be formed as a second gate insulating layer over the first gate insulating layer, so that the gate insulating layer 402 is formed.

The oxide semiconductor described in this embodiment is highly purified by removing an impurity so as not to contain an impurity that serves as a carrier donor and is a substance other than the main component of the oxide semiconductor as much as possible.

Such a highly purified oxide semiconductor is highly sensitive to an interface state density and interface electric charge; thus, an interface between the oxide semiconductor layer and the gate insulating layer is important. For that reason, the gate insulating layer that is to be in contact with the highly purified oxide semiconductor needs to have high quality.

For example, a high-density plasma CVD method using microwaves (e.g., a frequency of 2.45 GHz) is preferably adopted because an insulating layer can be dense and can have high withstand voltage and high quality. The highly purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a good-quality insulating layer as a gate insulating layer.

Further, an insulating layer whose film quality and interface characteristics between the insulating layer and an oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer.

In addition, an insulating material containing the same kind of component as the oxide semiconductor is preferably used for the gate insulating layer 402. Such a material is compatible with the oxide semiconductor; thus, when it is used for the gate insulating layer 402, the interface state between the oxide semiconductor and the gate insulating layer 402 can be kept favorably. Here, containing "the same kind of component as the oxide semiconductor" means containing one or more of elements selected from constituent elements of the oxide semiconductor. For example, in the case where the oxide semiconductor is formed using an In—Ga—Zn—based oxide semiconductor material, gallium oxide or the like is given as such an insulating material containing the same kind of component as the oxide semiconductor.

As a far preferable example of a stacked-layer structure for the gate insulating layer 402, a stacked-layer structure of a film (hereinafter referred to as a film a) formed using the insulating material containing the same kind of component as the oxide semiconductor and a film (hereinafter referred to as a film b) formed using a material different from the component material of the film a can be given. This is because with a structure in which the film a and the film b are stacked from the oxide semiconductor layer side in order, electric charge is preferentially trapped by an electric charge trapping center at the interface between the films a and b (compared with the interface between the oxide semiconductor layer and the film a), so that electric charge trapping at the interface of the oxide semiconductor layer can be sufficiently suppressed, leading to improvement in the reliability of the semiconductor device.

Further, in order that hydrogen, a hydroxyl group, and moisture might not be contained in the gate insulating layer 402 and the oxide semiconductor layer as much as possible, it is preferable that, as pretreatment before formation of the oxide semiconductor layer, the substrate 400 over which the gate electrode 401 is formed or the substrate 400 over which layers up to and including the gate insulating layer 402 are formed be preheated in a preheating chamber of a sputtering apparatus so that impurities such as hydrogen and moisture adsorbed to the substrate 400 are eliminated and exhausted. As an exhaustion unit provided for the preheating chamber, a cryopump is preferable. Note that this preheating treatment can be omitted. Further, this preheating may be similarly performed on the substrate 400 over which layers up to and including the source electrode 405a and the drain electrode 405b are formed, before the formation of the insulating layer 407.

Next, over the gate insulating layer 402, an oxide semiconductor layer with a thickness of greater than or equal to 2 nm and less than or equal to 200 nm, preferably greater than or equal to 5 nm and less than or equal to 30 nm is formed.

Note that before the oxide semiconductor layer is formed by a sputtering method, powder substances (also referred to as particles or dust) which are attached on a surface of the gate insulating layer 402 are preferably removed by reverse sputtering in which an argon gas is introduced and plasma is generated. The reverse sputtering refers to a method in which an RF power source is used for application of voltage to a substrate side in an atmosphere of a rare gas such as argon and plasma is generated around the substrate to modify a surface. Note that a nitrogen gas, a helium gas, an oxygen gas, or the like may be used in place of an argon gas.

Before formation of the oxide semiconductor layer, a halogen element may be introduced to an insulating layer (the gate insulating layer 402 in this embodiment) over which the oxide semiconductor layer is formed, by a method similar to oxygen plasma doping described below, by using a halogen gas such as a chlorine-based gas or a fluorine-based gas instead of an oxygen gas. In addition, the introduction of a halogen element may be performed by an ion implantation method or an ion doping method.

By introducing a halogen element to the insulating layer over which the oxide semiconductor layer is formed, hydrogen in the insulating layer can be fixed, so that diffusion of hydrogen from the insulating layer into the oxide semiconductor layer can be prevented. Oxygen may be introduced to the insulating layer at the same time as the halogen element. Note that such an element is preferably introduced under the condition where damage to the interface between the insulating layer and the oxide semiconductor layer can be minimized.

A metal oxide containing at least one element selected from In, Ga, Sn, and Zn can be used as the oxide semiconductor used for the oxide semiconductor layer. For example, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; or a Zn—O-based oxide semiconductor can be used. Further, $SiO_2$ may be contained in the above oxide semiconductor. In addition, Ga, Sn, Hf, Al, or a lanthanoid may be contained in the above oxide semiconductor.

Here, for example, an In—Ga—Zn—O-based oxide semiconductor means an oxide containing indium (In), gallium (Ga), and zinc (Zn), and there is no limitation on the composition ratio thereof. The In—Ga—Zn—O-based oxide semiconductor may contain an element other than In, Ga, and Zn.

Note that the oxide semiconductor may be amorphous or crystallized partly or entirely. When a crystalline oxide semiconductor is used as the oxide semiconductor, the oxide semiconductor is preferably formed over a level (flat) surface. Specifically, the oxide semiconductor is preferably formed over a surface whose average surface roughness (Ra) is 1 nm or less, more preferably 0.3 nm or less. Ra can be measured using an atomic force microscope (AFM).

As the oxide semiconductor layer, a thin film expressed by a chemical formula of $InMO_3(ZnO)_m$ (m>0) can be used. Here, M represents one or more metal elements selected from Sn, Zn, Ga, Al, Mn, and Co. For example, M can be Ga, Ga and Al, Ga and Mn, Ga and Co, or the like.

In this embodiment, the oxide semiconductor layer is formed using an In—Ga—Zn—O-based oxide target by a sputtering method. In addition, the oxide semiconductor layer can be formed by a sputtering method under a rare gas (typically, argon) atmosphere, an oxygen atmosphere, or a mixed atmosphere of a rare gas and oxygen.

As a target for forming the In—Ga—Zn—O-based oxide semiconductor by a sputtering method, for example, an oxide target having a composition ratio of $In_2O_3:Ga_2O_3:ZnO=1:1:1$ [molar ratio] is used to form an In—Ga—Zn—O layer. Without limitation to the material and the component of the target, for example, an oxide target having a composition ratio of $In_2O_3:Ga_2O_3:ZnO=1:1:2$ [molar ratio] may be used.

In the case where an In—Zn—O-based oxide semiconductor is formed, a target has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

An In—Sn—Zn—O-based oxide semiconductor can be referred to as ITZO. In the case where an In—Sn—Zn—O-based oxide semiconductor is formed, a target for formation of a film of ITZO by a sputtering method may have a composition ratio of In:Σv:Zn=1:2:2, In:Σv:Zn=2:1:3, In:Σv:Zn=1:1:1, or In:Σv:Zn=20:45:35 in an atomic ratio, for example.

The filling rate of the oxide target is higher than or equal to 90% and lower than or equal to 100%, preferably higher than or equal to 95% and lower than or equal to 99.9%. With the use of a metal oxide target with a high filling rate, the formed oxide semiconductor layer can have high density.

It is preferable that a high-purity gas from which impurities such as hydrogen, water, a hydroxyl group, and hydride are removed be used as a sputtering gas for the formation of the oxide semiconductor layer. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

When the oxide semiconductor layer is formed, the substrate is held in a film formation chamber kept under a reduced pressure, and the substrate temperature is set to temperatures higher than or equal to 100° C. and lower than or equal to 600° C., preferably higher than or equal to 300° C. and lower than or equal to 500° C. By heating the substrate during film formation, the impurity concentration in the oxide semiconductor layer formed can be reduced. In addition, damage by sputtering can be reduced. Then, a sputtering gas from which hydrogen and moisture have been removed is introduced into the film formation chamber while moisture remaining therein is removed, and the oxide semiconductor layer is formed over the substrate 400 with the use of the above target.

In order to remove moisture remaining in the film formation chamber, an entrapment vacuum pump such as a cryopump, an ion pump, or a titanium sublimation pump is preferably used. As an exhaustion unit, a turbo molecular pump provided with a cold trap may be used. In the film formation chamber which is exhausted with the cryopump, a hydrogen atom, a compound containing a hydrogen atom, such as water ($H_2O$), (more preferably, also a compound containing a carbon atom), and the like are exhausted, whereby the concentration of an impurity in the oxide semiconductor layer formed in the film formation chamber can be reduced.

An example of the film formation condition is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current power source is preferably used, in which case powder substances (also referred to as particles or dust) that are generated in film formation can be reduced and the film thickness can be uniform.

Next, first heat treatment is performed. By the first heat treatment, excessive hydrogen (including water and a hydroxyl group) in the oxide semiconductor layer can be removed (dehydration or dehydrogenation). In addition, defects at the interface between the oxide semiconductor layer and the insulating layer in contact with the oxide semiconductor layer can be reduced.

The first heat treatment is preferably performed at higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, more preferably less than or equal to 10 ppb in the case where measurement is performed using a dew-point meter of a cavity ring-down laser spectroscopy (CRDS) system). For example, the substrate is put in an electric furnace which is a kind of heat treatment apparatus, the oxide semiconductor layer is subjected to the heat treatment at 450° C. for one hour in a nitrogen atmosphere.

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA may be performed as follows. The substrate is transferred and put in an inert gas heated at a high temperature of higher than or equal to 650° C. and lower than or equal to 700° C., is heated for several minutes, and is transferred and taken out of the inert gas heated at the high temperature.

When the heat treatment is performed in an atmosphere of an inert gas such as nitrogen or a rare gas, oxygen, or ultra-dry air, it is preferable that the atmosphere do not contain water, hydrogen, or the like. The purity of nitrogen, oxygen, or the rare gas which is introduced into a heat treatment apparatus is set to 6N (99.9999%) or higher, preferably 7N (99.99999%) or higher (that is, the impurity concentration is 1 ppm or lower, preferably 0.1 ppm or lower).

Next, through a second photolithography step, the oxide semiconductor layer is processed into an island-shaped oxide semiconductor layer 441 (see FIG. 5B). A resist mask 420 for forming the island-shaped oxide semiconductor layer 441 may be formed using an inkjet method. Formation of the resist mask 420 by an inkjet method needs no photomask; thus, manufacturing cost can be reduced.

In the case where a contact hole is formed in the gate insulating layer 402, a step of forming the contact hole can be performed at the same time as processing of the oxide semiconductor layer.

Note that the etching of the oxide semiconductor layer may be performed using either or both dry etching and wet etching. As an etchant used for wet etching of the oxide semiconductor layer, a mixed solution of phosphoric acid, acetic acid, and nitric acid can be used, for example. In addition, ITO07N (produced by KANTO CHEMICAL CO., INC.) may also be used.

After the resist mask 420 is removed, oxygen 430 may be introduced to the oxide semiconductor layer 441 by an ion implantation method or an ion doping method. The introduction of the oxygen 430 may also be performed by an oxygen plasma doping method. Specifically, the oxygen 430 is made into plasma with the use of radio-frequency (RF) power, and oxygen radicals and/or oxygen ions are introduced to the oxide semiconductor layer over the substrate. At this time, it is preferable to apply a bias to the substrate over which the oxide semiconductor layer 441 is formed. By increasing the bias applied to the substrate, the oxygen 430 can be introduced more deeply (see FIG. 5C).

The oxygen 430 is supplied to the oxide semiconductor layer 441, so that the amount of oxygen in the oxide semiconductor layer 441 is greater than that in the stoichiometric proportion of the oxide semiconductor (preferably less than double of that in the stoichiometric proportion). This is because, when the amount of oxygen is too large, the oxide semiconductor layer 441 might absorb hydrogen like a hydrogen absorbing alloy (hydrogen storing alloy). When the amount of oxygen in the case of single crystal is Y, the amount of oxygen in the oxide semiconductor layer 441 is greater than Y, preferably greater than Y and less than 2Y. Alternatively, by setting the amount of oxygen Z in the oxide semiconductor in the case where the oxygen doping treatment is not performed as a reference, the amount of oxygen in the case where the oxygen doping treatment is performed can be expressed as follows: "the amount of oxygen is greater than Z, preferably, greater than Z and less than 2Z". The oxygen 430 introduced to the oxide semiconductor layer 441 by doping includes an oxygen radical, an oxygen atom, and/or an oxygen ion. Accordingly, the amount of oxygen is greater than that of hydrogen in the oxide semiconductor layer.

For example, when the composition of the oxide semiconductor layer 441 is expressed by $InGaZnO_x$, the chemical formula derived from the single crystal structure of an oxide containing In:Ga:Zn=1:1:1 is $InGaZnO_4$; therefore, the oxide semiconductor layer 441 having an oxygen excess region in which x is greater than 4 and less than 8 is formed. In a similar manner, when the composition of the oxide semiconductor layer 441 is expressed by $InGaZn_2O_x$, the oxide semiconductor layer 441 having an oxygen excess region in which x is greater than 5 and less than 10 is formed. Note that the oxygen excess region has only to exist in part (including the interface) of the oxide semiconductor layer.

In the oxide semiconductor layer, oxygen is one of the main components. Thus, it is difficult to accurately estimate the oxygen concentration of the oxide semiconductor layer by a method such as secondary ion mass spectrometry (SIMS). In other words, it is hard to determine whether oxygen is intentionally added to the oxide semiconductor layer.

It is known that there are isotopes of oxygen, such as $O^{17}$ and $O^{18}$, and that the proportions of $O^{17}$ and $O^{18}$ in all of the oxygen atoms in nature are about 0.037% and about 0.204%, respectively. That is to say, it is possible to measure the concentrations of these isotopes in the oxide semiconductor layer by a method such as SIMS; therefore, the oxygen concentration of the oxide semiconductor layer may be able to be estimated more accurately by measuring the concentrations of these isotopes. Thus, the concentrations of these isotopes may be measured to determine whether oxygen is intentionally added to the oxide semiconductor layer.

For example, when the concentration of $O^{18}$ is used as a reference, concentration D1 of the isotope of oxygen ($O^{18}$) in an oxygen-added region and concentration D2 of the isotope of oxygen ($O^{18}$) in a non-oxygen-added region have a relationship represented by D1 ($O^{18}$)>D2 ($O^{18}$).

The oxygen 430 added to (contained in) the oxide semiconductor layer 441 preferably has at least partly a dangling bond of oxygen in the oxide semiconductor. This is because, with the dangling bond, the oxygen 430 can be bonded to hydrogen which can remain in the layer, so that the hydrogen can be fixed (made to be an immovable ion).

Oxygen (an oxygen radical, an oxygen atom, and/or an oxygen ion) added to the oxide semiconductor layer 441 may be supplied from a plasma generating apparatus with the use of a gas containing oxygen or from an ozone generating apparatus. More specifically, for example, the oxygen 430 can be generated with an apparatus for etching treatment on a semiconductor device, an apparatus for ashing on a resist mask, or the like to process the oxide semiconductor layer 441.

The oxygen 430 is introduced to the oxide semiconductor layer 441, so that the oxide semiconductor layer 441 which contains excessive oxygen is formed. The electronegativity of oxygen, which is 3.0, is larger than the electronegativity of a metal (Zn, Ga, In) in the oxide semiconductor layer, which is about 2.0; thus, excessive oxygen contained as compared with hydrogen deprives the M-H bond of a hydrogen atom, so that an OH group is formed. This OH group may form an M-O-H group by being bonded to M.

That is, by the introduction of oxygen, a bond between a metal included in the oxide semiconductor and hydrogen or a bond between the metal and a hydroxyl group is cut. At the same time, the hydrogen or the hydroxyl group reacts with oxygen to produce water. In particular, oxygen having a dangling bond easily reacts with hydrogen remaining in the oxide semiconductor to produce water. Consequently, hydrogen or a hydroxyl group which is an impurity can be easily eliminated as water in second heat treatment performed later.

After the introduction of the oxygen 430 to the oxide semiconductor layer 441, the second heat treatment is performed (preferably at higher than or equal to 200° C. and lower than or equal to 600° C., for example, at higher than or equal to 250° C. and lower than or equal to 550° C.). For example, the second heat treatment is performed at 450° C. for one hour in a nitrogen atmosphere. It is preferable that the above atmosphere do not contain water, hydrogen, or the like.

Through the above steps of the introduction of the oxygen 430 and the heat treatment, dehydration or dehydrogenation of the oxide semiconductor layer can be performed, and impurities including hydrogen molecules such as hydrogen, moisture, a hydroxyl group, or hydride (also referred to as a hydrogen compound) which cannot be removed thoroughly in the first heat treatment can be removed from the oxide semiconductor layer 441. Further, it is possible to supply oxygen, which is one of the main components of the oxide semiconductor and is reduced at the same time as a step for removing impurities, so that the oxide semiconductor layer 441 can be made to be i-type (intrinsic). In addition, defects generated at the interface between the oxide semiconductor layer and the insulating layer in contact with the oxide semiconductor layer can be reduced. As a result, the oxide semiconductor layer 441 can be changed into the oxide semiconductor layer 403 which is made to be electrically i-type.

Next, a conductive layer to be a source electrode and a drain electrode (including a wiring formed in the same layer as the source electrode and the drain electrode) is formed over the gate insulating layer 402 and the oxide semiconductor layer 403. As the conductive layer used for the source electrode and the drain electrode, for example, a metal layer containing an element selected from Al, Cr, Cu, Ta, Ti, Mo, W, and Mg, a metal nitride layer containing any of the above elements as a component (a titanium nitride film, a molybdenum nitride film, or a tungsten nitride film), or the like can be used. A metal layer having a high melting point such as Ti, Mo, W, or the like or a metal nitride layer of any of these elements (a titanium nitride film, a molybdenum nitride film, and a tungsten nitride film) may be stacked on one of or both of a lower side and an upper side of a metal layer of Al, Cu, or the like. Further, the conductive layer used for the source electrode and the drain electrode may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

A resist mask is formed over the conductive layer in a third photolithography step. Etching is selectively performed, so that the source electrode 405a and the drain electrode 405b are formed. After that, the resist mask is removed.

The channel length L of the transistor 410 is determined by the distance between the source electrode 405a and the drain electrode 405b which are in contact with the oxide semiconductor layer 403 (see FIG. 5E).

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor layer 403 when the conductive layer is etched. However, it is difficult to obtain etching conditions in which only the conductive layer is etched and the oxide semiconductor layer 403 is not etched at all. In some cases, only part of the oxide semiconductor layer 403 is etched to be an oxide semiconductor layer having a groove portion (a recessed portion) when the conductive layer is etched.

In this embodiment, a Ti film is used as the conductive layer and an In—Ga—Zn—O-based oxide semiconductor is used as the oxide semiconductor layer; thus, ammonia hydrogen peroxide (a mixed solution of ammonia, water, and hydrogen peroxide) is preferably used as an etchant.

Next, the insulating layer 407 is formed over the source electrode 405a and the drain electrode 405b to be in contact with part of the oxide semiconductor layer 403 (see FIG. 5D).

The insulating layer 407 can be formed to a thickness of at least 1 nm using a method by which impurities such as water and hydrogen do not enter the insulating layer 407, such as a sputtering method, as appropriate. There is no particular limitation on the method for forming the insulating layer 407; for example, a film formation method such as a plasma CVD method or a sputtering method can be used. A sputtering method is appropriate in terms of low possibility of entry of hydrogen, water, and the like. When hydrogen is contained in the insulating layer 407, entry of the hydrogen into the oxide semiconductor layer or extraction of oxygen from the oxide semiconductor layer by the hydrogen is caused, thereby making the resistance of the backchannel (a region of a semiconductor layer which is not on the gate electrode side; in the transistor 410, a region of the oxide semiconductor layer 403 which is around the interface with the insulating layer 407) of the oxide semiconductor layer low (to have an n-type conductivity), so that a parasitic channel might be formed. Therefore, it is important to form the insulating layer 407 by a method by which hydrogen and an impurity containing hydrogen are not contained therein.

As the insulating layer 407, an inorganic insulating material such as silicon oxide, silicon oxynitride, hafnium oxide, aluminum oxide, or gallium oxide can be typically used. Gallium oxide is a material which is hardly charged; therefore, variation in the threshold voltage due to charge buildup of the insulating layer can be suppressed. As the insulating layer 407 or an insulating layer stacked over or under the insulating layer 407, a metal oxide layer including the same kind of component as the oxide semiconductor may be formed.

In this embodiment, a 200-nm-thick silicon oxide layer is formed as the insulating layer 407 by a sputtering method. The substrate temperature in film formation may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, a silicon oxide target or a silicon target can be used. For example, the silicon oxide layer can be formed using a silicon target by a sputtering method in an atmosphere containing oxygen.

In order to remove remaining moisture from the film formation chamber at the time of formation of the oxide semiconductor or the insulating layer 407, an entrapment vacuum pump (such as a cryopump) is preferably used. When the insulating layer 407 is formed in the film formation chamber exhausted using a cryopump, the impurity concentration in the insulating layer 407 can be reduced. In addition, as an exhaustion unit for removing moisture remaining in the film formation chamber of the insulating layer 407, a turbo molecular pump provided with a cold trap may be used.

It is preferable that a high-purity gas from which impurities such as hydrogen, water, a hydroxyl group, or hydride are removed be used as a sputtering gas when the insulating layer 407 is formed.

Then, third heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). For example, the third heat treatment may be performed at 450° C. for one hour in a nitrogen atmosphere. In the third heat treatment, part of the oxide semiconductor layer (channel formation region) is heated in the state where it is in contact with the insulating layer 407. It is preferable that the above atmosphere do not contain water, hydrogen, or the like.

In the case where the heat treatment is performed in the state where the oxide semiconductor layer is in contact with the insulating layer 407 containing oxygen, oxygen can be further supplied to the oxide semiconductor layer from the insulating film 407 containing oxygen. Note that the insulating layer 407 is preferably an insulating layer including an oxygen excess region.

Through the above-described process, the transistor 410 is formed. The transistor 410 is a transistor including the oxide semiconductor layer 403 from which impurities such as hydrogen, moisture, a hydroxyl group, or hydride (also referred to as a hydrogen compound) are intentionally removed and which is made to be i-type by supplying oxygen. Therefore, variation in the electric characteristics of the transistor 410 is suppressed and the transistor 410 is electrically stable.

A protective insulating layer 409 may be formed over the insulating layer 407. For example, an aluminum oxide layer is formed by a plasma CVD method, a sputtering method, or the like. The protective insulating layer 409 is preferably formed using a material which hardly contains impurities such as moisture and has a high barrier property against an alkali metal, hydrogen, and oxygen. Specifically, a silicon nitride layer, an aluminum nitride layer, an aluminum oxide layer, or the like is preferably used. In this embodiment, aluminum oxide is used for the protective insulating layer 409 (see FIG. 5E).

Aluminum oxide used for the protective insulating layer 409 is formed in such a manner that the substrate 400 over which layers up to and including the insulating layer 407 are formed is heated at higher than or equal to 100° C. and lower than or equal to 400° C., a sputtering gas containing high-purity oxygen from which hydrogen and water are removed is introduced, and a target of aluminum is used. In this case, the protective insulating layer 409 is preferably formed while removing moisture remaining in a treatment chamber, in a manner similar to that of the insulating layer 407.

By using a material having a high barrier property for the protective insulating layer 409, elimination of oxygen from the oxide semiconductor layer can be prevented. In particular, using a material having a high barrier property for formation of the protective insulating layer 409 and the gate insulating layer 402 or a base layer (not illustrated) is effective. That is, when materials having a high barrier property are provided so that the oxide semiconductor layer is provided therebetween, reliability of the semiconductor device can be increased.

After the transistor 410 is formed, heat treatment may be further performed at higher than or equal to 100° C. and lower than or equal to 200° C. for longer than or equal to 1 hour and shorter than or equal to 30 hours in the air. This heat treatment may be performed at a fixed temperature. Alternatively, the following change in temperature is set as one cycle and may be repeated plural times: the temperature is increased from room temperature to a heating temperature and then decreased to room temperature.

Alternatively, without performing the first heat treatment, the second heat treatment may be performed under the condition of the first heat treatment.

Figure 7A:
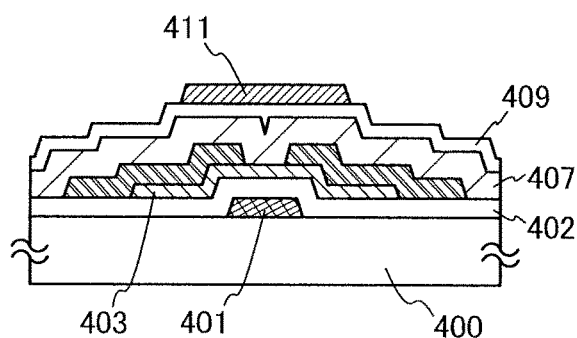
FIGS. 7A to 7D are cross-sectional views of semiconductor devices.

An example in which a back gate electrode is formed in the transistor 410 is illustrated in FIG. 7A. The back gate electrode is positioned so that the channel formation region of the semiconductor layer is interposed between the gate electrode and the back gate electrode. The back gate electrode is formed using a conductive layer and can function in a manner similar to that of the gate electrode. By changing a potential of the back gate electrode, the threshold voltage of the transistor can be changed.

The back gate electrode can be formed using a material and a method similar to those of the gate electrode, the source electrode, the drain electrode, and the like.

In FIG. 7A, a back gate electrode 411 is formed over the channel formation region of the oxide semiconductor layer 403 with the insulating layer 407 and the protective insulating layer 409 provided therebetween. Although FIG. 7A illustrates the example in which the back gate electrode 411 is formed over the protective insulating layer 409, the back gate electrode 411 may be formed between the insulating layer 407 and the protective insulating layer 409.

An oxide semiconductor used for a semiconductor layer in this embodiment is highly purified by removing hydrogen, which serves as a donor, from an oxide semiconductor as much as possible so as not to contain impurities that are not main components of the oxide semiconductor as much as possible. In addition, the oxide semiconductor is made to be an i-type (intrinsic) oxide semiconductor or a substantially i-type oxide semiconductor by supplying oxygen. Accordingly, the oxide semiconductor layer used in the transistor is an oxide semiconductor layer which is made to be electrically i-type.

In addition, the i-type oxide semiconductor includes extremely small number (close to zero) of carriers and the carrier concentration can be lower than $1 \times 10^{14}/cm^3$, preferably lower than $1 \times 10^{12}/cm^3$, more preferably lower than $1 \times 10^{11}/cm^3$.

Since the oxide semiconductor includes extremely few carriers, off-state current of a transistor can be reduced. The smaller the amount of off-state current is, the better.

Specifically, in the transistor including the above oxide semiconductor in the channel formation region, the off-state current per micrometer in channel width at room temperature can be less than or equal to 10 aA ($1 \times 10^{-17}$ A), less than or equal to 1 aA ($1 \times 10^{-18}$ A), further less than or equal to 1 zA ($1 \times 10^{-21}$ A), still further less than or equal to 1 yA ($1 \times 10^{-24}$ A).

In addition, on-state current of the transistor including the above oxide semiconductor in the channel formation region has almost no temperature dependence, and the variation in off-state current is extremely small.

A transistor including the above oxide semiconductor for a channel formation region is a transistor having high reliability in which the amount of change in threshold voltage of the transistor by the bias-temperature stress (BT) test can be reduced.

A transistor including the above oxide semiconductor can have high field-effect mobility, whereby high-speed operation is possible.

As described above, a semiconductor device including an oxide semiconductor, which has stable electric characteristics, can be provided. Therefore, a semiconductor device with high reliability can be provided.

This embodiment can be implemented in combination with another embodiment as appropriate.

Embodiment 4

In this embodiment, a transistor having a structure different from that of the transistor described in Embodiments 3 will be described. Note that the same portions as those in the above embodiments, portions having functions similar to those in the above embodiments, the same steps as those in the above embodiments, and steps similar to those in the above embodiments may be described as in the above embodiments, and repeated description is omitted in this embodiment. Further, a specific description for the same portions is omitted.

Figure 6A:
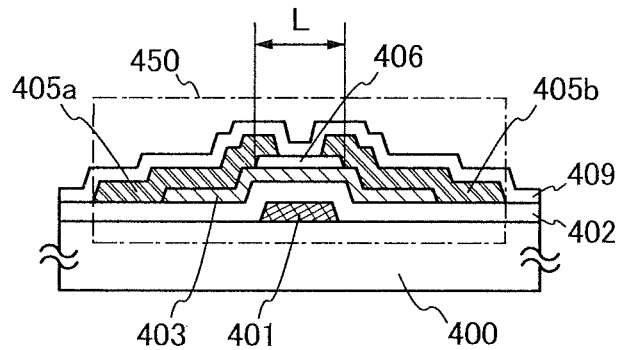
FIGS. 6A to 6C are cross-sectional views of semiconductor devices.

A transistor 450 illustrated in FIG. 6A includes, over a substrate 400, a gate electrode 401, a gate insulating layer 402, an oxide semiconductor layer 403, a channel protective layer 406, a source electrode 405a, and a drain electrode 405b. A protective insulating layer 409 is formed over the transistor 450. The transistor 450 is one of bottom-gate transistors referred to as a channel-protective type (channel-stop type) and is also one of inverted staggered transistors.

The oxide semiconductor layer 403 and a channel protective layer 406 are preferably formed successively without exposing the interface between the oxide semiconductor layer 403 and the channel protective layer 406 to the air. By forming the oxide semiconductor layer 403 and the channel protective layer 406 successively without exposure to the air, impurities such as water, hydrogen, or hydrocarbon can be prevented from being attached to the interface between the oxide semiconductor layer 403 and the channel protective layer 406.

The channel protective layer 406 can be formed using a material and a method similar to those of the gate insulating layer 402. In addition, a metal oxide including the same kind of component as the oxide semiconductor may be used for the channel protective layer 406. By using the metal oxide including the same kind of component as the oxide semiconductor for the channel protective layer 406, accumulation of hydrogen ions at the interface between the metal oxide and the oxide semiconductor and the vicinity thereof can be suppressed or prevented. Specifically, as the metal oxide, a material including an oxide of one or more of metal elements selected from constituent elements of the oxide semiconductor is preferably used.

Note that gallium oxide is preferably used for the metal oxide layer. Since gallium oxide has a wide band gap (Eg), by providing gallium oxide layers with the oxide semiconductor layer provided therebetween, an energy barrier is formed at the interface between the oxide semiconductor layer and the metal oxide layer to prevent carrier transfer at the interface. Consequently, carriers are not transferred from the oxide semiconductor to the metal oxide, but are transferred within the oxide semiconductor layer. On the other hand, hydrogen ions pass through the interface between the oxide semiconductor layer and the metal oxide layer and are accumulated in the vicinity of an interface between a surface of the metal oxide layer in contact with the oxide semiconductor layer and the opposite surface, for example. The above region is apart from a region where carriers flow, which results in no affect or a very slight affect on the threshold voltage of the transistor. Note that in the case where the gallium oxide is in contact with the In—Ga—Zn—O-based material, the energy barrier is about 0.8 eV on the conduction band side and about 0.9 eV on the valence band side.

The protective insulating layer 409 which prevents impurities such as moisture or hydrogen from entering from the outside is preferably formed over the channel protective layer 406, the source electrode 405a, and the drain electrode 405b so that these impurities are not included in the oxide semiconductor layer 403 again. The protective insulating layer 409 can be formed in a manner similar to that in Embodiment 3.

In addition, a gallium oxide film may be formed as the protective insulating layer 409 or an insulating layer stacked over or under the protective insulating layer 409. Gallium oxide is a material which is hardly charged; therefore, variation in threshold voltage due to electric charge buildup of the insulating layer can be suppressed.

Note that the channel length L of the transistor 450 is determined by the width of the channel protective layer 406 in contact with the oxide semiconductor layer 403 in a direction parallel with a carrier flow direction.

Figure 7B:
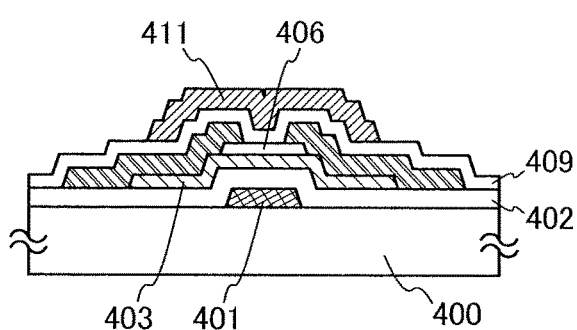

An example in which a back gate electrode 411 is formed in the transistor 450 is illustrated in FIG. 7B. The back gate electrode 411 is formed over the channel formation region of the oxide semiconductor layer 403 with the protective insulating layer 409 provided therebetween. Although FIG. 7B illustrates the example in which the back gate electrode 411 is formed over the protective insulating layer 409, the back gate electrode 411 may be formed over the channel protective layer 406 by using the same layer as the source electrode 405a and the drain electrode 405b.

Figure 6B:
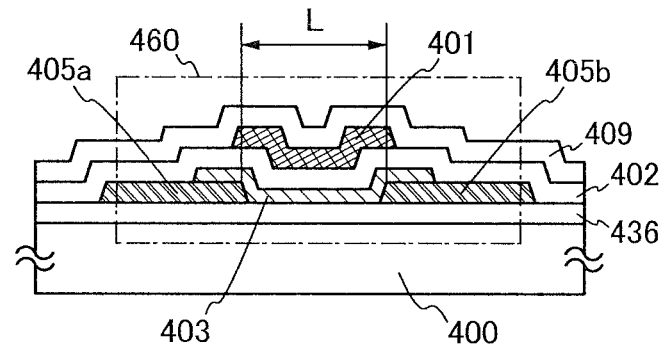

A transistor 460 illustrated in FIG. 6B includes, over a substrate 400, a source electrode 405a, a drain electrode 405b, an oxide semiconductor layer 403, a gate insulating layer 402, and a gate electrode 401. A base layer 436 is formed between the substrate 400 and the oxide semiconductor layer 403. The protective insulating layer 409 is formed over the transistor 460. The transistor 460 is one of top-gate transistors and is also one of staggered transistors.

The base layer 436 can be formed in a manner similar to that of the base layer described in Embodiment 3. By using a metal oxide including the same kind of component as the oxide semiconductor for the base layer 436, accumulation of hydrogen ions at the interface between the metal oxide and the oxide semiconductor and the vicinity thereof can be suppressed or prevented. Specifically, as the metal oxide, a material including an oxide of one or more of metal elements selected from constituent elements of the oxide semiconductor is preferably used.

In the transistor 460, after a conductive layer is formed over the base layer 436, the source electrode 405a and the drain electrode 405b are formed through a first photolithography step. The source electrode 405a and the drain electrode 405b can be formed by using a material and a method similar to those of the source electrode 405a and the drain electrode 405b described in Embodiment 3.

Exposure at the time of the formation of the resist mask in the first photolithography step may be performed using ultraviolet light, KrF laser light, or ArF laser light. The channel length L of the transistor 460 is determined by the distance between the source electrode 405a and the drain electrode 405b which are in contact with the oxide semiconductor layer 403. In the case where light exposure is performed for a channel length L of less than 25 nm, the light exposure at the time of the formation of the resist mask in the first photolithography step is preferably performed using extreme ultraviolet light having an extremely short wavelength of several nanometers to several tens of nanometers. In the light exposure by extreme ultraviolet light, the resolution is high and the focus depth is large. Therefore, the channel length L of the transistor to be formed later can be longer than or equal to 10 nm and shorter than or equal to 1000 nm, whereby operation speed of a circuit can be increased.

The protective insulating layer 409 which prevents impurities such as moisture or hydrogen from entering from the outside is preferably formed over the gate electrode 401 and the gate insulating layer 402 so that these impurities are not included in the oxide semiconductor layer 403 again. The protective insulating layer 409 can be formed in a manner similar to that in Embodiment 3.

In addition, a gallium oxide layer may be formed as the protective insulating layer 409 or an insulating layer stacked over or under the protective insulating layer 409. Gallium oxide is a material which is hardly charged; therefore, variation in threshold voltage due to electric charge buildup of the insulating layer can be suppressed.

Figure 7C:
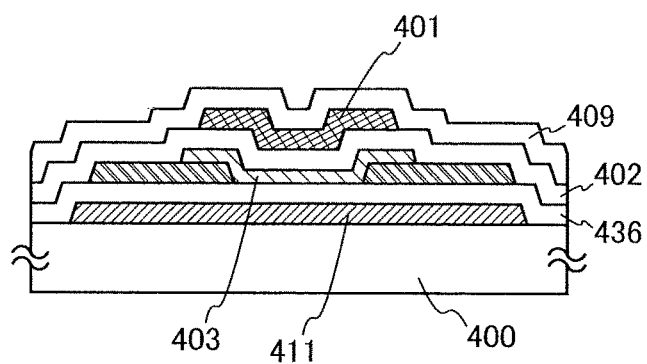

An example in which the back gate electrode 411 is formed in the transistor 460 is illustrated in FIG. 7C. The back gate electrode 411 is formed in a region overlapping with the channel formation region of the oxide semiconductor layer 403 with the base layer 436 provided therebetween. By changing a potential of the back gate electrode 411, the threshold voltage of the transistor can be changed.

Figure 6C:
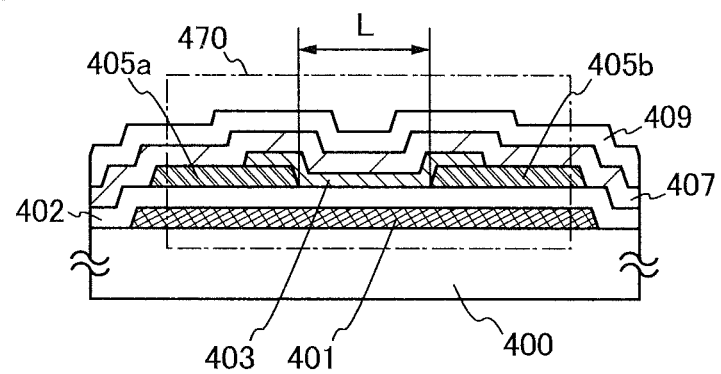

The transistor 470 illustrated in FIG. 6C includes, over a substrate 400, a gate electrode 401, a gate insulating layer 402, the oxide semiconductor layer 403, a source electrode 405a, and a drain electrode 405b. An insulating layer 407 and a protective insulating layer 409 are stacked over the transistor 470 in order. The transistor 470 is one of bottom-gate transistors.

The channel length L of the transistor 470 is determined by the distance between the source electrode 405a and the drain electrode 405b which are in contact with the oxide semiconductor layer 403.

Figure 7D:
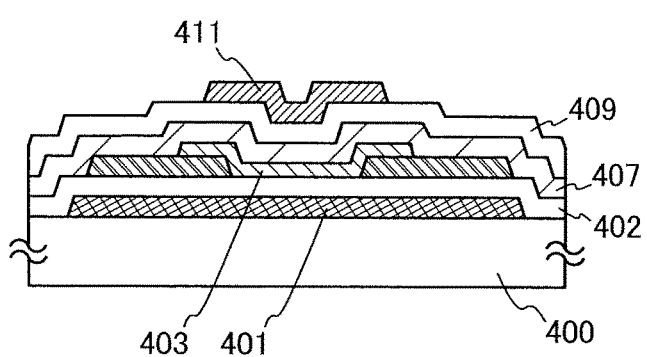

An example in which the back gate electrode 411 is formed over the transistor 470 is illustrated in FIG. 7D. The back gate electrode 411 is positioned so that the channel formation region of the semiconductor layer is interposed between the gate electrode and the back gate electrode 411. The back gate electrode 411 is formed using a conductive layer and is made to function in a manner similar to that of the gate electrode. By changing a potential of the back gate electrode 411, the threshold voltage of the transistor can be changed.

The back gate electrode 411 can be formed using a material and a method similar to those of the gate electrode, the source electrode, the drain electrode, and the like.

Embodiment 5

In this embodiment, the case where the semiconductor device described in any of the above embodiments is applied to an electronic device will be described with reference to FIGS. 8A to 8F. In this embodiment, cases where the above semiconductor device is applied to electronic devices such as a computer, a mobile phone (also referred to as a mobile telephone or a mobile telephone device), a portable information terminal (including a portable game machine, an audio reproducing device, and the like), a digital camera, a digital video camera, an electronic paper, or a television device (also referred to as a television or a television receiver) will be described.

Figure 8A:
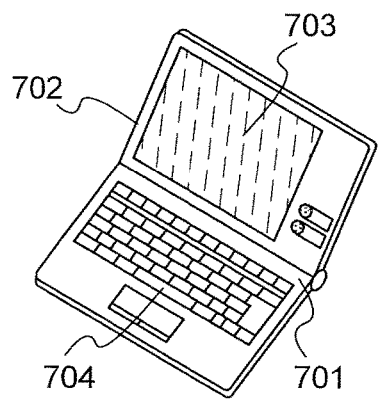
FIGS. 8A to 8F illustrate electronic devices including a semiconductor device.

FIG. 8A illustrates a laptop personal computer including a housing 701, a housing 702, a display portion 703, a keyboard 704, and the like. Each of the housings 701 and 702 is provided with the semiconductor device described in the above embodiments. Therefore, a laptop personal computer in which writing and reading of data are performed at high speed, stored data is held for a long time, and power consumption is sufficiently reduced can be realized.

Figure 8D:
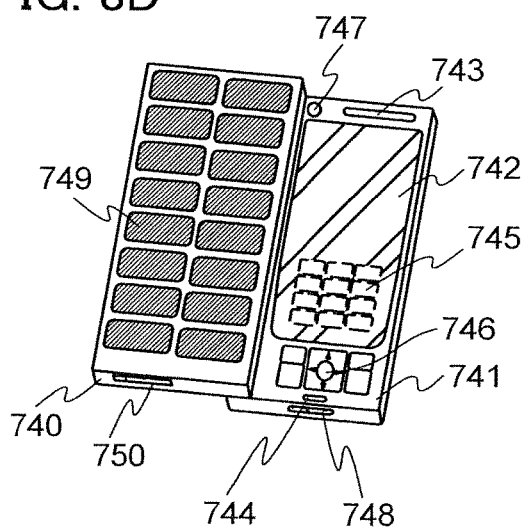
Figure 8B:
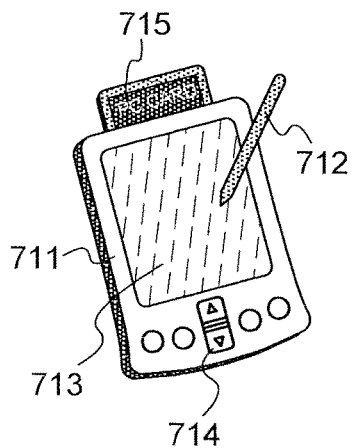

FIG. 8B illustrates a portable information terminal (PDA). A main body 711 is provided with a display portion 713, an external interface 715, operation buttons 714, and the like. Further, a stylus 712 and the like for operation of the portable information terminal are provided. The main body 711 is provided with the semiconductor device described in the above embodiments. Therefore, a portable information terminal in which writing and reading of data are performed at high speed, stored data is held for a long time, and power consumption is sufficiently reduced can be realized.

Figure 8E:
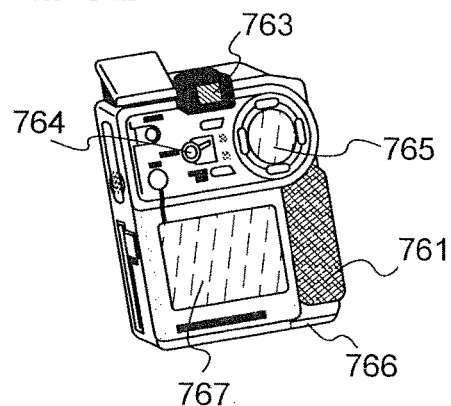
Figure 8C:
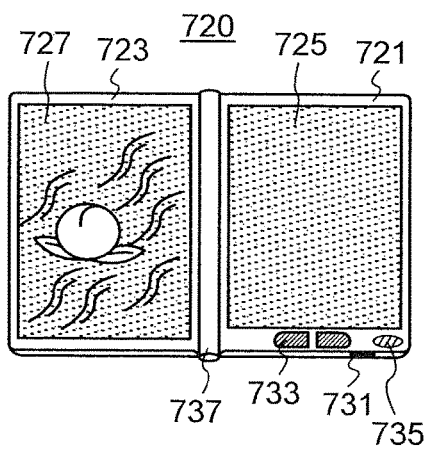

FIG. 8C illustrates an e-book reader 720 mounted with an electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housing 721 and the housing 723 is provided with the semiconductor device described in the above embodiments. Therefore, an e-book reader in which writing and reading of data are performed at high speed, stored data is held for a long time, and power consumption is sufficiently reduced can be realized.

FIG. 8D illustrates a mobile phone, which includes two housings, a housing 740 and a housing 741. Further, the housing 740 and the housing 741 in a state where they are developed as illustrated in FIG. 8D can shift by sliding so that one is lapped over the other; therefore, the size of the mobile phone can be reduced, which makes the mobile phone suitable for being carried. The housing 741 includes a display panel 742, a speaker 743, a microphone 744, a pointing device 746, a camera lens 747, an external connection terminal 748, and the like. The housing 740 includes a solar cell 749 for charging the mobile phone, an external memory slot 750, and the like. In addition, an antenna is incorporated in the housing 741.

The display panel 742 has a touch panel function. A plurality of operation keys 745 which are displayed as images are illustrated by dashed lines in FIG. 8D. Note that the display panel 742 is also mounted with a booster circuit for raising a voltage output from the solar cell 749 to a voltage needed for each circuit.

At least one of the housings 740 and 741 is provided with the semiconductor device described in the above embodiments. Therefore, a mobile phone in which writing and reading of data are performed at high speed, stored data is held for a long time, and power consumption is sufficiently reduced can be realized.

FIG. 8E is a digital camera including a main body 761, a display portion 767, an eyepiece 763, an operation switch 764, a display portion 765, a battery 766, and the like. The main body 761 is provided with the semiconductor device described in the above embodiments. Therefore, a digital camera in which writing and reading of data are performed at high speed, stored data is held for a long time, and power consumption is sufficiently reduced can be realized.

Figure 8F:
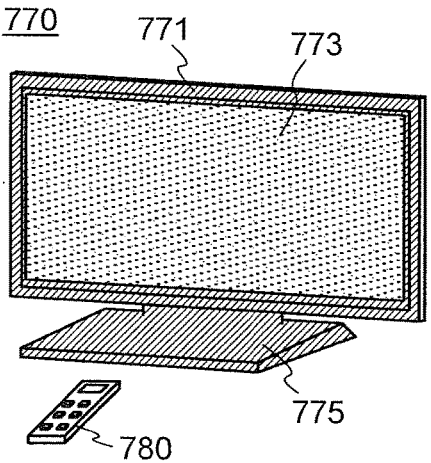

FIG. 8F illustrates a television device 770 including a housing 771, a display portion 773, a stand 775, and the like. The television device 770 can be operated with an operation switch of the housing 771 or a remote controller 780. The semiconductor device described in the above embodiments is mounted on the housing 771 and the remote controller 780. Therefore, a television set in which writing and reading of data are performed at high speed, stored data is held for a long time, and power consumption is sufficiently reduced can be realized.

As described above, the electronic devices described in this embodiment each include the semiconductor device described in the above embodiments. Therefore, electronic devices with low power consumption can be realized.

EXPLANATION OF REFERENCE

200: memory cell, 201: first transistor, 202: second transistor, 203: back gate electrode, 211: first wiring, 212: second wiring, 213: third wiring, 214: fourth wiring, 215: fifth wiring, 220: capacitor, 250: memory cell, 281: node, 301: process, 302: process, 303: judgment, 304: process, 305: judgment, 306: process, 307: judgment, 311: process, 312: process, 313: process, 314: process, 400: substrate, 401: gate electrode, 402: gate insulating layer, 403: oxide semiconductor layer, 405a: source electrode, 405b: drain electrode, 406: channel protective layer, 407: insulating layer, 409: protective insulating layer, 410: transistor, 411: back gate electrode, 420: resist mask, 430: oxygen, 436: base layer, 441: oxide semiconductor layer, 450: transistor, 460: transistor, 470: transistor, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power supply, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller, 1200: memory cell, 1201: first transistor, 1202: second transistor, 1203: back gate electrode, 1211: first driver circuit, 1212: second driver circuit, 1213: third driver circuit, 1214: fourth driver circuit, 1300: memory cell array.

This application is based on Japanese Patent Application serial no. 2010-116025 filed with Japan Patent Office on May 20, 2010, the entire contents of which are hereby incorporated by reference.

The invention claimed is:

1. A method for driving a semiconductor device which comprises a memory cell comprising a first transistor and a second transistor, wherein one of a source electrode and a drain electrode of the second transistor is electrically connected to a gate electrode of the first transistor, and which further comprises a bit line electrically connected to the other of the source electrode and the drain electrode of the second transistor, comprising:
- turning on the second transistor and supplying a potential supplied to the bit line to the gate electrode of the first transistor to write a data to the memory cell;
- turning off the second transistor and holding a potential of the gate electrode of the first transistor; and
- reading out the data from the memory cell by changing the potential of a control signal line.

2. The method for driving a semiconductor device, according to claim 1, wherein the potential held on the gate electrode of the first transistor is one of a plurality of different potentials.

3. The method for driving a semiconductor device, according to claim 2, wherein a potential difference between the plurality of different potentials is twice or more as large as a standard deviation of variation in a threshold voltage of the first transistor.

4. The method for driving a semiconductor device, according to claim 1, wherein the potential held on the gate electrode of the first transistor is a potential at which the first transistor is turned off.

5. A method for driving a semiconductor device which comprises a memory cell comprising a first transistor comprising a back gate electrode, a control signal line electrically connected to one of a source electrode and a drain electrode of the first transistor, and a reading signal line electrically connected to the other of the source electrode and the drain electrode of the first transistor, comprising:
- turning on a second transistor and supplying a potential supplied to a bit line to a gate electrode of the first transistor to write a data to the memory cell;
- turning off the second transistor and holding a potential of the gate electrode of the first transistor;
- supplying a reading control potential to the control signal line and detecting a potential change of the reading signal line; and
- reading out the data from the memory cell by the potential change.

6. The method for driving a semiconductor device, according to claim 5,
- wherein the reading control potential comprises a plurality of different potentials, and
- wherein the reading control potential comprising the plurality of different potentials is supplied to the control signal line sequentially from the smallest absolute value of the plurality of different potentials.

7. A method for driving a semiconductor device which comprises a memory cell comprising a first transistor and a second transistor, wherein one of a source electrode and a drain electrode of the second transistor is electrically connected to a gate electrode of the first transistor, and which further comprises a bit line electrically connected to the other of the source electrode and the drain electrode of the second transistor, comprising:
- turning on the second transistor and supplying a potential supplied to the bit line to the gate electrode of the first transistor to write a data to the memory cell;
- turning off the second transistor and holding a potential of the gate electrode of the first transistor; and
- reading out the data from the memory cell by changing the potential of a control signal line,
- wherein at least one of the first transistor and the second transistor comprises an oxide semiconductor film.

8. The method for driving a semiconductor device, according to claim 7, wherein the potential held on the gate electrode of the first transistor is one of a plurality of different potentials.

9. The method for driving a semiconductor device, according to claim 8, wherein a potential difference between the plurality of different potentials is twice or more as large as a standard deviation of variation in a threshold voltage of the first transistor.

10. The method for driving a semiconductor device, according to claim 7, wherein the potential held on the gate electrode of the first transistor is a potential at which the first transistor is turned off.

11. A method for driving a semiconductor device which comprises a memory cell comprising a first transistor comprising a back gate electrode and a second transistor, wherein one of a source electrode and a drain electrode of the second transistor is electrically connected to a gate electrode of the first transistor, and which further comprises a bit line electrically connected to the other of the source electrode and the drain electrode of the second transistor, a control signal line electrically connected to one of a source electrode and a drain electrode of the first transistor, and a reading signal line electrically connected to the other of the source electrode and the drain electrode of the first transistor, comprising:
- turning on the second transistor and supplying a potential supplied to the bit line to the gate electrode of the first transistor to write a data to the memory cell;
- turning off the second transistor and holding a potential of the gate electrode of the first transistor;
- supplying a reading control potential to the control signal line and detecting a potential change of the reading signal line; and
- reading out the data from the memory cell by the potential change.

12. The method for driving a semiconductor device, according to claim 11, wherein the potential held on the gate electrode of the first transistor is one of a plurality of different potentials.

13. The method for driving a semiconductor device, according to claim 12, wherein the potential held on the gate electrode of the first transistor is a potential at which the first transistor is turned off.

14. The method for driving a semiconductor device, according to claim 12, wherein a potential difference between the plurality of different potentials is twice or more as large as a standard deviation of variation in a threshold voltage of the first transistor.

15. The method for driving a semiconductor device, according to claim 11,
- wherein the reading control potential comprises a plurality of different potentials, and
- wherein the reading control potential comprising the plurality of different potentials is supplied to the control signal line sequentially from the smallest absolute value of the plurality of different potentials.

16. The method for driving a semiconductor device, according to claim 11, wherein at least one of the first transistor and the second transistor comprises an oxide semiconductor film.

* * * * *